(12) United States Patent
Tsuchi

(10) Patent No.: US 11,862,058 B2
(45) Date of Patent: Jan. 2, 2024

(54) LOAD DRIVING CIRCUIT, DISPLAY DRIVER, DISPLAY APPARATUS AND SEMICONDUCTOR DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 17/989,660

(22) Filed: Nov. 17, 2022

(65) Prior Publication Data

US 2023/0169898 A1    Jun. 1, 2023

(30) Foreign Application Priority Data

Nov. 30, 2021  (JP) ................................. 2021-194370

(51) Int. Cl.
| | | |
|---|---|---|
| G09G 3/36 | (2006.01) | |
| G09G 3/00 | (2006.01) | |
| H03K 17/56 | (2006.01) | |
| G09G 3/3225 | (2016.01) | |

(52) U.S. Cl.
CPC ............. *G09G 3/006* (2013.01); *H03K 17/56* (2013.01); *G09G 3/3225* (2013.01); *G09G 3/3648* (2013.01); *G09G 2310/0291* (2013.01); *G09G 2330/021* (2013.01); *G09G 2330/12* (2013.01)

(58) Field of Classification Search
CPC .............................................. G09G 2310/0291
See application file for complete search history.

(56) References Cited

U.S. PATENT DOCUMENTS

| | | | |
|---|---|---|---|
| 6,911,858 B2* | 6/2005 | Mori .................. | H03M 1/1019 330/253 |
| 2007/0058312 A1* | 3/2007 | Nishida ................ | H02H 11/005 361/93.1 |

FOREIGN PATENT DOCUMENTS

JP    2000275610    10/2000

* cited by examiner

*Primary Examiner* — Nan-Ying Yang
(74) *Attorney, Agent, or Firm* — JCIPRNET

(57) ABSTRACT

Provided is an output amplifier having: a push-pull output-stage formed by first and second output-stage transistors; and a detection circuit detecting an abnormal output current output by the output amplifier and including: a coupling circuit, generating first and second currents mirroring current flowing in the first output-stage transistor and third and fourth currents mirroring current flowing in the second output-stage transistor, coupling the first and third currents at a first output node, outputting a first voltage at the first output node, coupling the second and fourth currents at a second output node, and outputting a second voltage at the second output node; and a determination circuit, outputting a determination signal indicating normality of an output current based on the first and second voltages. The coupling circuit generates the first to fourth currents. In the reference state, the third current >the first current, the second current >the fourth current.

18 Claims, 12 Drawing Sheets

| State | O1 | O2 | Determination result (JD) |
|---|---|---|---|
| 1 | L | H | Normal |
| 2 | L | L | Abnormal (output current of transistor 12 is abnormal) |
| 3 | H | H | Abnormal (output current of transistor 11 is abnormal) |

FIG. 2B

| State | O1 | O2 | Determination result (JD) |
|---|---|---|---|
| 1 | L | H | Normal |
| 2 | L | L | Abnormal (output current of transistor 11 is abnormal) |
| 3 | H | H | Abnormal (output current of transistor 12 is abnormal) |

FIG. 4B

LOAD DRIVING CIRCUIT, DISPLAY DRIVER, DISPLAY APPARATUS AND SEMICONDUCTOR DEVICE

CROSS-REFERENCE TO RELATED APPLICATION

This application claims priority under 35 USC 119 from Japanese Patent application No. 2021-194370 filed on Nov. 30, 2021, the disclosure of which is incorporated by reference herein.

BACKGROUND

Technical Field

The invention relates to a load driving circuit generating a driving current (voltage) driving a load, a display driver including the load driving circuit, a display apparatus including the load driver, and a semiconductor device.

Description of Related Art

Currently, as a main display apparatus, a display apparatus of an active matrix driving type using liquid crystal or organic EL in a display panel is conventionally known.

In the display panel, on an insulating transparent substrate, such as a glass substrate, a plastic substrate, etc., multiple data lines respectively extending in a vertical direction of a two-dimensional frame and multiple gate lines respectively extending in a horizontal direction of the two-dimensional frame are disposed to intersect each other. In addition, a pixel part connected with the data line and the gate line is formed at each of the intersections between the data lines and the gate lines. Each pixel part includes a thin film transistor (TFT) switch and a pixel electrode, and when the TFT switch is turned ON by a gate signal supplied to the gate line, a gradation data signal supplied to the data line is supplied to the pixel electrode via the TFT.

The display panel of a liquid crystal display apparatus is formed by encapsulating liquid crystal devices between a semiconductor substrate on which thin film semiconductor circuits are formed and an opposite substrate on which opposite electrodes are formed on the entire surface. In the liquid crystal display apparatus, gradation display is performed by controlling the transmittance of backlight provided on the back surface of the display panel by using a liquid crystal application voltage. Color display is realized by assigning three primary colors of RGB to each pixel and synthesizing the three primary colors through by using an LED backlight and a color filter together.

Meanwhile, the display panel of an organic EL display apparatus is formed by a semiconductor substrate on which thin film semiconductor circuits and organic EL elements are formed for respective pixel parts. In each pixel part, a pixel circuit performing current conversion on a gradation data signal supplied to the pixel electrode and supplying the current to the organic EL element is formed. The organic EL display apparatus performs gradation display by controlling the light emission intensity of the organic EL element through the current supplied to the organic EL element of each pixel part. The color display is realized through light emitted by organic EL elements of three primary colors, i.e., RGB, assigned to each pixel, or through synthesis of the three primary colors achieved through the combination of a color filter and the light emitted by a single-color organic EL element.

Together with the display panel, the display apparatus includes, as a load driving circuit driving the display panel as a load, a gate driver and a data driver as follows.

The gate driver supplies a horizontal scan signal to the gate line. The horizontal scan signal exerts control to turn on, in order, the TFT switch at each pixel column unit.

The data driver generates a gradation signal having an analog voltage value corresponding to the luminance level of each pixel, and supplies the gradation signal, as a data pulse of one scan period unit, to the data line.

FIG. 1 is a block diagram schematically illustrating a configuration of an active matrix type display apparatus.

The display apparatus shown in FIG. 1 includes a display panel 150 and a controller 130. The display panel 150 includes gate lines GL1 to GLr arranged in the horizontal direction on an insulating substrate, data lines DL1 to DLm arranged in the vertical direction, and pixel parts 154 arranged in a matrix at the intersection parts between the respective gate lines and data lines. On the display panel 150, a gate driver 110 driving each gate line and a data driver 120, as a display driver, driving each data line are provided. The controller 130 adjusts the output timings of the gate driver 110 and the data driver 120.

The gate driver 110 is supplied with a signal group GS form the controller 130, and outputs a scan signal supplied to each gate line based on the signal group GS. The data driver 120 is supplied with a video data signal VDS including CLK, a control signal, and a video data signal, etc., from the controller 130, and, based on the video data signal VDS, outputs a gradation signal supplied to each data line.

It is noted that the data driver 120 is usually formed by using a silicon LSI, and is implemented to an end part of the display panel 150 by using chip-on-glass (COG) or chip-on-film (COF). In the case where the data driver 120 is formed by multiple individual ICs, the video data signal VDS corresponding to the data line and each responsible for driving is supplied to each data driver IC from the controller 130. In the case where the data driver 120 is a single IC or formed by a limited number of ICs, the controller 130 may be built in the data driver 120. In such case, the signal group supplied from the outside to the controller 130 is directly supplied to the data driver 120.

Meanwhile, in recent years, the resolution of display panels has been increasing, and the wiring width as well as the wiring interval have been decreasing together with the decrease of the pixel pitch. As a consequence, the risk of failure in a display panel is increased.

Therefore, in recent years, a demand for providing a function of detecting a display panel abnormality or failure after the gate driver, the data driver, and the controller are installed is increased. Also, in a display panel to be mounted in a vehicle, in order to avoid the situation of a frozen display image, there is a demand for a function of quickly detecting a display panel abnormality.

Therefore, a liquid crystal display apparatus in which a circuit that detects and determines a flaw or defective state of a display panel is built in the data driver, and it does not require an external inspection apparatus, has been proposed (see, for example, FIGS. 1 and 4 of Japanese Patent Application Laid-open (JP-A) No. 2000-275610). Such liquid crystal display apparatus includes a switching circuit for a normal operation mode and an inspection mode as well as a comparator, and is further provided with a determination circuit that determines whether the display panel is normal or abnormal based on a comparison result of comparing, by the comparator, a signal voltage supplied to the data line and a reference voltage set in advance, at the time of the inspection mode.

In the liquid crystal display apparatus disclosed in JP-A No. 2000-275610, the voltage of the output end of an output amplifier included in the data driver is detected, while the data line of the display panel is driven by the output amplifier. Therefore, it is particularly difficult to detect, in a high sensitivity, an abnormality, such as a small-scale short circuit, generated between the data line and other wirings in the display panel.

In addition, the determination circuit (see, for example, FIG. 4 of JP-A No. 2000-275610) of the liquid crystal display apparatus is formed by a resistor generating the reference voltage and the comparator. Therefore, the detection accuracy may be varied due to variations of the resistor or variations of a threshold voltage of a transistor forming the comparator.

Moreover, a circuit operated by using the same power potential as that of the output amplifier, that is, a voltage higher than the power potential of a logic circuit is adopted as the switching circuit or the determination circuit for the normal operation mode and the inspection mode. Therefore, the chip size, as well as the cost, may be increased.

SUMMARY

An aspect of the disclosure provides a load driving circuit. The load driving circuit includes: an output amplifier, having a push-pull output-stage formed by a first output-stage transistor and a second output-stage transistor having different conductivity types, and outputting an output current output from the push-pull output-stage to a load; and a detection circuit, detecting a change of the output current. The detection circuit includes: a coupling circuit, respectively generating a first current and a second current that are mirror currents with respect to a current flowing in one of the first output-stage transistor and the second output-stage transistor, respectively generating a third current and a fourth current that are mirror currents with respect to a current flowing in an other of the first output-stage transistor and the second output-stage transistor, coupling the first current and the third current at a first output node to output a voltage generated at the first output node as a first voltage, and coupling the second current and the fourth current at a second output node to output a voltage generated at the second output node as a second voltage. The coupling circuit respectively generates the first to fourth currents, so that, in a reference state in which the output current is stable within a predetermined range, the third current is greater than the first current and the second current is greater than the fourth current. The detection circuit detects, based on the first voltage and the second voltage output from the coupling circuit, whether the output current is changed from the reference state or not.

A display driver according to another aspect of the disclosure includes k load driving circuits, k being an integer of 2 or more. The display driver outputs a determination signal, which indicates whether the output current is changed from the reference state or not, to outside while respectively outputting k output currents output from the k load driving circuits to k data lines of a display panel.

A display apparatus according to yet another aspect of the invention includes the display driver.

BRIEF DESCRIPTION OF THE DRAWINGS

FIG. 2B is a diagram illustrating a determination operation of a determination circuit 60 included in the load driving circuit 100.

FIG. 4B is a diagram illustrating a determination operation of the determination circuit 60 included in the load driving circuit 100A.

DESCRIPTION OF THE EMBODIMENTS

The invention provides a load driving circuit capable of suppressing the increase in device scale, and sensitively, accurately, and quickly detecting the abnormality of a current output to a load to drive the load, a display driver including multiple load driving circuits, a display panel including the display driver, and a semiconductor device.

According to the invention, by adopting a simple configuration of a detection circuit without using a resistor or a comparator, the abnormality of a current output to the load can be quickly, accurately, and sensitively detected without increasing the device scale.

Embodiment 1

Figure 2A:
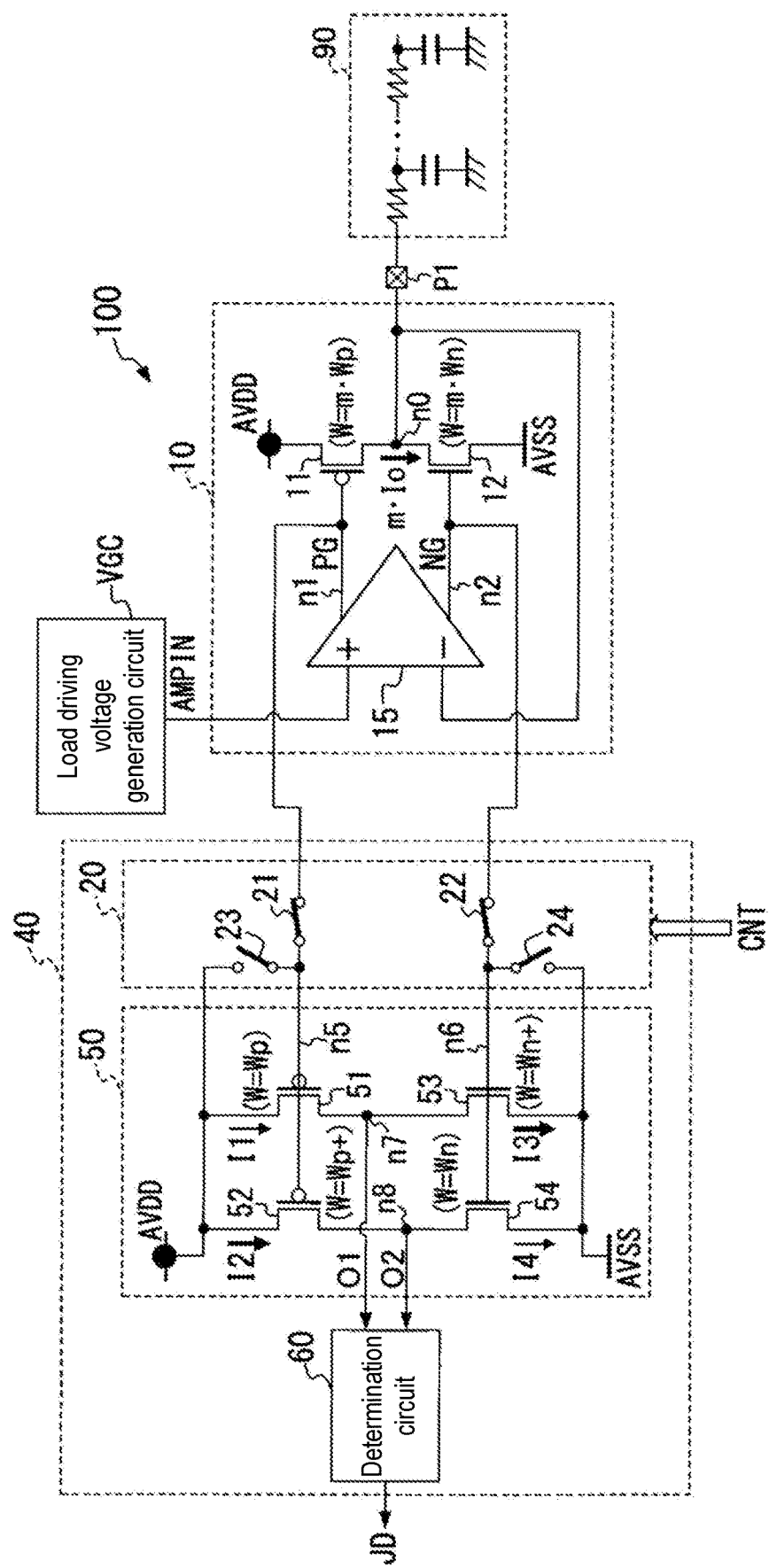
FIG. 2A is a circuit diagram illustrating a configuration of a load driving circuit 100 according to a first embodiment.

FIG. 2A is a circuit diagram illustrating a configuration of a load driving circuit 100 according to a first embodiment of the invention.

The load driving circuit 100 shown in FIG. 2A is formed in a semiconductor IC chip as a semiconductor device, and is a circuit for driving a capacitive load 90 such as a data line of a liquid crystal display panel or an organic EL display panel. It is noted that a load component other than the display panel or a load circuit such as an electric circuit realizing various functions may also serve as the load 90.

The load driving circuit 100 includes a load driving voltage generation circuit VGC, an output amplifier 10, and a detection circuit 40. The load driving voltage generation circuit VGC, the output amplifier 10, and the detection circuit 40 receive a load driving power potential AVDD via an AVDD power terminal as well as a load driving ground potential AVSS via an AVSS power terminal.

The load driving voltage generation circuit VGC generates a driving voltage AMPIN having a voltage value for driving the load 90, and supplies the driving voltage AMPIN to the output amplifier 10. The output amplifier 10 outputs an output current to the load 90 connected to an output terminal P1 via the output terminal P1, so that the voltage of the output terminal P1 is equal to the driving voltage AMPIN.

The detection circuit 40 detects whether the output current transmitted by the output amplifier 10 to the capacitive load 90 is in an output stable state. That is, since the voltage of the output end of the output amplifier 10 is consistent with the voltage value corresponding to the driving voltage AMPIN, the detection circuit 40 detects whether the output current is changed from a stable state (referred to as "reference state" in the following) within a predetermined range close to zero, including a state in which the output current is zero. The detection circuit 40 outputs a determination signal JD indicating that the output current is abnormal in the case where a change from the reference state (output stable state) in the output current is detected and that the output current is normal in the case where such change is not detected.

The output amplifier 10 has a push-pull output-stage and a differential stage 15. The push-pull output-stage is formed by a Pch transistor 11 (referred to as "Pch" in the following) and an Nch transistor 12 (referred to as "Nch" in the following) as a first transistor and a second transistor whose conductivity types are different from each other.

The differential stage 15 is an operational amplifier that receives the driving voltage AMPIN by using its own non-inverting input end (+) and receives the voltage (referred to as "output voltage") of the output terminal P1 by using its own inverting input terminal (−).

The differential stage 15 generates signals PG and NG having levels corresponding to the difference between the driving amplifier AMPIN and the output voltage. That is, the different stage 15 generates the signal PG whose level is lower as the driving voltage AMPIN is higher than the output voltage and the difference is greater, and generates the signal NG whose level is higher as the driving voltage AMPIN is lower than the output voltage and the difference is greater. The differential stage 15 supplies the signal PG to the gate of the transistor 11 via a node n1, and supplies the signal NG to the gate of the transistor 12 via a node n2.

The source of the transistor 11 serving as a push-pull output-stage (referred to as the output-stage transistor 11) is applied with the load driving power potential AVDD, and the drain of the transistor 11 is connected to a node n0, the output terminal P1, and the drain of the transistor 12. The source of the output-stage transistor 12 is applied with the ground potential AVSS. The output-stage transistor 11 transmits the output current corresponding to the signal PG received by its own gate to the node n0 via its own drain.

The source of the transistor 12 serving as a push-pull output-stage (referred to as the output-stage transistor 12) is applied with the load driving ground potential AVSS, and the drain of the transistor 12 is connected to the output terminal P1 and the drain of the transistor 11. The output-stage transistor 12 extracts the output current corresponding to the signal NG received by its own gate from the node n0.

At the push-pull output-stage, when one of the current (charging current) transmitted by the output-stage transistor 11 to the output terminal P1 based on the power potential AVDD and the current (discharging current) extracted by the output-stage transistor 12 from the output terminal P1 to the terminal side of the ground potential AVSS generates an increasing effect, the other generates a decreasing effect. That is, a push-pull operation is performed. According to the above configuration, the output current obtained by subtracting the discharging current from the charging current is transmitted to the load 90 via the node n0 and the output terminal P1. Accordingly, an output driving signal having the driving voltage AMPIN is generated at the node n0, and the load 90 is driven by the output driving signal.

The detection circuit 40 includes an active/inactive switching circuit 20, a coupling circuit 50, and a determination circuit 60.

The active/inactive switching circuit 20 includes switches 21 and 23 set to one of the ON state and the OFF state complementary to each other and switches 22 and 24 set to one of the ON state and the OFF state complementary to each other. The active/inactive switching circuit 20 receives a control signal CNT that prompts various kinds of operation control.

Here, in the case of receiving the control signal CNT that prompts to activate the detection circuit 40, the active/inactive switching circuit 20 sets the switches 21 and 22 to the OFF state, and the switches 23 and 24 to the ON state. Accordingly, the node n1 of the output amplifier 10 is connected with a node n5 of the coupling circuit 50, the node n2 of the output amplifier 10 is connected with a node n6 of the coupling circuit 50, and the detection circuit 40 becomes active (enabled) and performs the detection operation of the output current to be described afterwards.

Meanwhile, in the case of receiving the control signal CNT that prompts to deactivate the detection circuit 40, the active/inactive switching circuit 20 sets the switches 23 and 24 to the OFF state, and the switches 21 and 22 to the ON state. Accordingly, the node n5 is applied with the load driving power potential AVDD, the node n6 is applied with the load driving ground potential AVSS, and the connection between the node n1 and the node n5 and the connection between the node n2 and the node n6 are cut off together. Accordingly, the detection circuit 40 becomes inactive (disabled), and the detection operation of the output current to be described afterwards is stopped.

Switches set to the ON state or the OFF state in association with the switches 23 and 24 may be further provided between a node n7 and the AVSS power terminal and between a node n8 and the AVDD power terminal.

The coupling circuit 50 is formed by a Pch transistor 51 as the first transistor, a Pch transistor 52 as the second transistor, an Nch transistor 53 as the third transistor, and an Nch transistor 54 as the fourth transistor. The source of each of the transistors 51 and 52 is applied with the power potential AVDD, and the gate of each of the transistors 51 and 52 is connected to the node n5. The drain of the transistor 51 is connected to the drain of the transistor 53 via the node n7. The drain of the transistor 52 is connected to the drain of the transistor 54 via the node n8. The gate of each of the transistors 53 and 54 is connected to the node n6, and the source of each of the transistors 53 and 54 is applied with the ground potential AVSS.

With such configuration, in the coupling circuit 50, a first mirror current pair (I1, I3) with respect to the currents flowing in the output-stage transistors 11 and 12 of the output amplifier 10 is generated by using the transistors 51 and 53. In addition, a second mirror current pair (I2, I4) with respect to the currents flowing in the output-stage transistors 11 and 12 of the output amplifier 10 is generated by using the transistors 52 and 54.

That is, the transistor 51 generates the first current I1 of the source type including a mirror current with respect to the current flowing in the output-stage transistor 11, and the transistor 52 generates the second current I2 of the source type including a mirror current with respect to the current flowing in the output-stage transistor 11. The transistor 53 generates the third current I3 of the sink type including a mirror current with respect to the current flowing in the output-stage transistor 12, and the transistor 54 generates the fourth current I4 of the sink type including a mirror current with respect to the current flowing in the output-stage transistor 12.

Here, in the coupling circuit 50, the first current I1 and the third current I3 are coupled at the node n7. That is, the first current I1 is transmitted to the node n7, and the third current I3 is extracted from the node n7. Accordingly, in the coupling circuit 50, the voltage generated at the node n7 is output as a first voltage O1.

In addition, in the coupling circuit 50, the second current I2 and the fourth current I4 are coupled at the node n8. That is, the second current I2 is transmitted to the node n8, and the fourth current I4 is extracted from the node n8. Accordingly, in the coupling circuit 50, the voltage generated at the node n8 is output as a second voltage O2.

That is, the node n7 serves as the first output node of the coupling circuit 50, and the node n8 serves as the second output node of the coupling circuit 50.

It is noted that, for the transistors 51 to 54, transistors whose current output capabilities are respectively set, so that in the reference state (output stable state) of the output current, the third current I3 is greater than the first current I1, and the fourth current I4 is smaller than the second current I2, are used.

The determination unit 60 receives the first voltage and the second voltage (O1, O2), and, based on the logic values of the first voltage and the second voltage, detects whether there is a change from the reference state (output stable state) with respect to the output current of the output amplifier 10 and the tendency of the change. In addition, based on whether there is a detected change and the tendency of the change, in the case where the determination circuit 60 determines whether the output current of the output amplifier 10 is normal or abnormal and determines that the output current is abnormal, the determination circuit 60 determines that an abnormal current flows in one of the output-stage transistors 11 and 12. The determination circuit 60 outputs a determination signal JD indicating the determination result. It is noted that the determination circuit 60 is formed in a logic circuit operated by using a power potential VDD and a ground potential VSS for a logic circuit.

FIG. 2B is a diagram illustrating a determination operation of the determination circuit 60 based on the first voltage and the second voltage (O1, O2) in the load driving circuit 100 shown in FIG. 2A.

As shown in FIG. 2B, in the case where the binary logic values (L or H) represented by the first voltage O1 and the second voltage O2 are different from each other, the determination circuit 60 outputs the determination signal JD indicating that the output current of the output amplifier 10 is normal. Meanwhile, in the case where the logic values represented by the voltages O1 and O2 are equal, such as the case where the logic values are both the logic values L, the determination circuit 60 outputs the determination signal JD indicating that there is abnormality in the output current output by the output-stage transistor 12 of the output amplifier 10. Also, in the case where the logic values represented by the voltages O1 and O2 are both H, the determination circuit 60 outputs the determination signal JD indicating that there is abnormality in the output current output by the output-stage transistor 11 of the output amplifier 10.

In the following, the operation of the load driving circuit 100 shown in FIGS. 2A and 2B will be further described with details.

As shown in FIG. 2A, the voltages supplied to the sources and the gates of the transistors 51 and 52 of the coupling circuit 50 and the output-stage transistor 11 are the same. Therefore, the transistors 51 and 52 generate the mirror currents I1 and I2 corresponding to the current flowing in the output-stage transistor 11. Likewise, the voltages supplied to the sources and the gates of the transistors 53 and 54 and the output-stage transistor 12 are the same. Therefore, the transistors 53 and 54 generate the mirror currents I3 and I4 corresponding to the current flowing in the output-stage transistor 12. In addition, the currents I1 and I3 generated by using the transistors 51 and 53 form the first mirror current pair with respect to the currents flowing in the output-stage transistors 11 and 12. In addition, the currents I2 and I4 generated by using the transistors 52 and 54 form the second mirror current pair with respect to the currents flowing in the output-stage transistors 11 and 12.

The four currents I1, I2, I3, and I4 generated in the coupling circuit 50 are formed by the source-type currents I1 and I2 mirroring the current of the output-stage transistor 11 and the sink-type currents I3 and I4 mirroring the current of the output-stage transistor 12. The coupling circuit 50 couples the source-type current I1 and the sink-type current I3 at the first output end (node n7) and outputs the voltage O1, and couples the source-type current I2 and the sink-type current I4 at the second output end (node n8) and outputs the voltage O2.

In the coupling circuit 50, the respective current output capabilities of the transistors 51 to 54 are set, so that, in the reference state of the output amplifier 10, $$I1 < I3 \text{ and } I2 > I4$$

among the currents I1, I2, I3, and I4.

Accordingly, in the reference state, the voltage of the first output end (node n7) of the coupling circuit 50 is at a low level (AVSS), the voltage of the second output end (node n8) is at a high level (AVSS), and the logic values of the output voltages (O1, O2) is (L, H).

Here, in the case where an abnormal current flows from the output amplifier 10 to the load 90, the current of one of the output-stage transistors 11 and 12 increases, and the current of the other decreases. In this case, the voltages (O1, O2) output from the coupling circuit 50 becomes (L, L) or (H, H).

The determination circuit 60 receives two voltages (O1, O2) output from the coupling circuit 50, and, based on the logic values of the voltages (O1, O2), determines whether the output current of the output amplifier 10 is changed from the reference state and outputs the determination signal JD.

The determination circuit 60 performs determination based on the logic values of the output voltages (O1, O2) of the coupling circuit 50, as shown in FIG. 2B. The determination circuit 60 determines that the output current is in the reference state when the voltages (O1, O2) are (L, H). Meanwhile, when the voltages (O1, O2) are (L, L), the determination circuit 60 detects that the current of the output-stage transistor 12 increases by a predetermined amount or more and determines that the output current is abnormal, and when the voltages (O1, O2) are (H, H), the determination circuit 60 detects that the current of the output-stage transistor 11 increases by a predetermined amount or more and determines the output current is abnormal.

Then, in the coupling circuit 50, the setting of the magnitude of each of the currents I1, I2, I3, and I4 in the reference state is described.

The ratio of the current values of the currents I1, I2, I3, and I4 in the reference state can be set by using a channel width ratio of the transistors 51, 52, 53, and 54, for example. At the time of the reference state as described above, currents (m·Io) respectively flowing in the output-stage transistors 11 and 12, that is, idling currents, are equal.

Here, the channel width of each of the transistors 51 to 54 is set as follows in order to suppress the current consumption of the detection circuit 40.

For example, in the case where the output-stage transistor 11 is set as a transistor of a total channel width (m·Wp) formed by connecting in parallel m (m being an integer of 1 or more) transistors having a predetermined channel width Wp, the channel width of each of the transistors 51 and 52 is set to the channel width Wp. In addition, in the case where the output-stage transistor 12 is set as a transistor of a total channel width (m·Wn) formed by connecting in parallel m transistors having a predetermined channel width Wn, the channel width of each of the transistors 53 and 54 is set to the channel width Wn. Accordingly, each current of the detection circuit 40 is suppressed to one-$m^{th}$ of the current flowing in the output-stage transistors 11 and 12.

Specifically, the channel widths of the transistors 51 and 54 are respectively set as Wp and Wn, the channel width of the transistor 53 is set as Wn+ greater than Wn, and the channel width of the transistor 52 is set as Wp+ greater than Wp.

Accordingly, the relationship among the magnitudes of the current values of the currents I1, I2, I3, and I4 in the reference state can be set as follows:

$I1<I3$ and $I2>I4$.

It is noted that, regarding the channel length, it is preferable that the channel lengths of transistors of the same conductivity type are the same in order to match the threshold voltage. In addition, regarding the setting of the magnitude of the currents I1 and I3 and the magnitude of the currents I2 and I4, such magnitudes are set by taking into consideration the sensitivity and the accuracy for detecting the change from the reference state in the currents flowing in the output-stage transistors 11 and 12. That is, in the case where the currents of the output-stage transistors 11 and 12 are changed, and the actual currents I1 and I3 are changed by reversing the current magnitude relationship of I1<I3 in the reference state into I1>I3, or the actual currents I2 and I4 are changed by reversing the current magnitude relationship of I2>I4 in the reference state into I2<I4, the logic values of the voltages (O1, O2) are changed from the values in the reference state, and the output current is determined as abnormal by the determination circuit 60.

It is noted that, with respect to a slight change due to element manufacturing variation or the ambient temperature within a predetermined range, the amplitudes of the currents in the reference state can be set within a range of the reference state by setting I1<I3 and I2>I4.

In the following, the effects of the detection circuit 40 shown in FIG. 2A will be described.

The detection circuit 40 adopts a configuration in which the mirror currents of the currents flowing in the output-stage transistors 11 and 12 forming the push-pull output-stage are generated, the mirror currents of the source type and the sink type are coupled, and the output voltages (O1, O2) are extracted from the coupling points thereof.

Therefore, in the case where an abnormal current flows from the output amplifier 10 to the load 90, the current of one of the output-stage transistors 11 and 12 increases, and the current of the other decreases. At the same time, the mirror currents of the output-stage transistors 11 and 12 generate the same current change. Therefore, even if a relatively large current difference is set in the currents I1 and I3 and the currents I2 and I4 in the reference state, in the case where an abnormal current flows through, the output voltages (O1, O2) quickly transition to the logical values (L, L) or (H, H) indicating the determination result.

Therefore, the influence of the transistor manufacturing variation on the detection circuit 40 is reduced, and the detection circuit 40 is capable of sensitively and accurately detecting an output current abnormality in a quick response. It is noted that, in the detection circuit 40 shown in FIG. 2A, whether the current amounts of the currents flowing in the output-stage transistors 11 and 12 are changed from the reference state is detected, and an analog/digital conversion circuit converting the detection into a two-bit digital value is realized.

In the following, an example of an abnormal current detection operation by the load driving circuit 100 shown in FIG. 2A is described with reference to FIG. 3.

Figure 3:
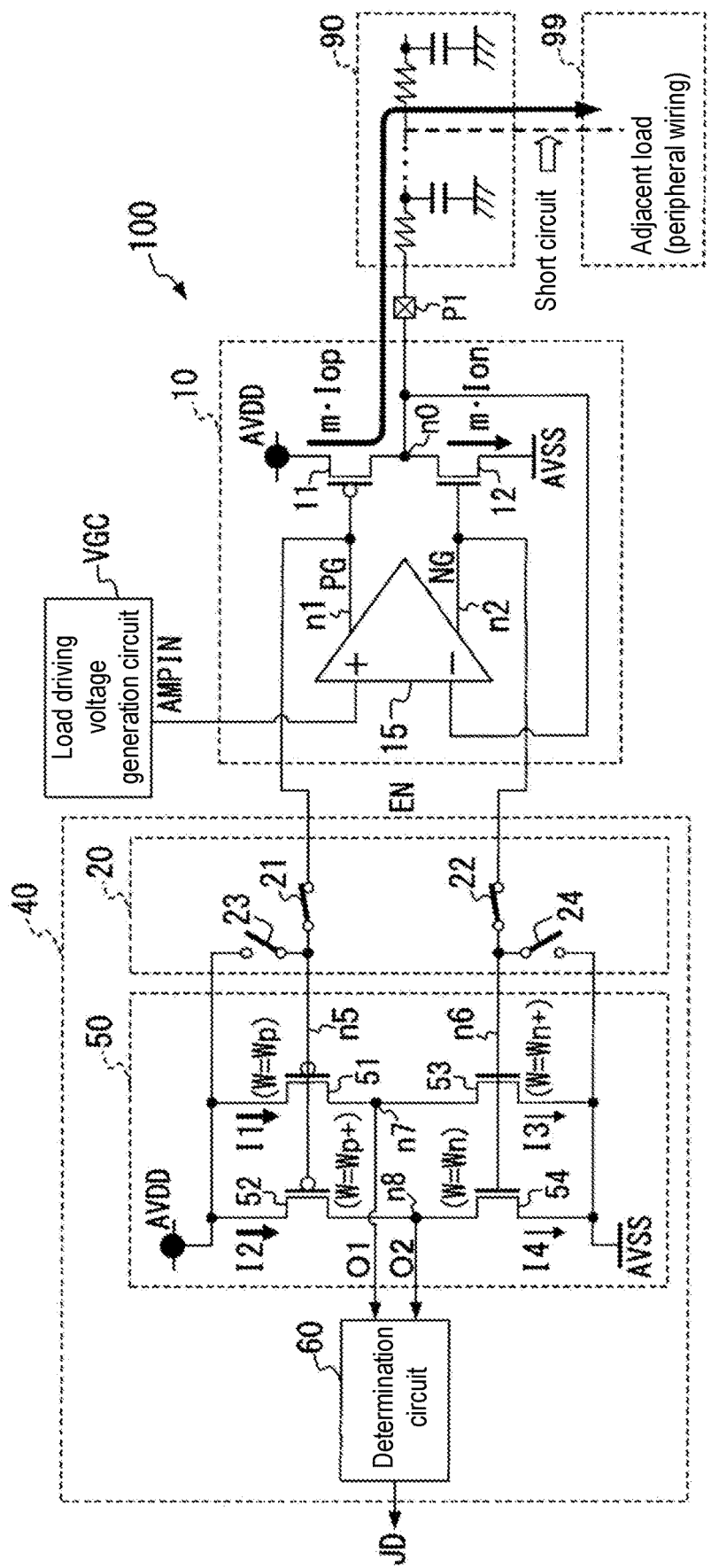
FIG. 3 is a diagram illustrating an example of an abnormal current detection operation by using the load driving circuit 100.

In the example shown in FIG. 3, the configuration of the load driving circuit 100 and the size of each transistor are the same as those shown in FIG. 2A. In addition, in the example shown in FIG. 3, the load 90 is set as a data line (capacitive load) of the display panel, and the data line of the load 90 is short-circuited with an adjacent load (or a peripheral wiring) 99 due to a crack, etc., generated in the display panel. Because of the short circuit, a current is discharged from the data line of the load 90 to the adjacent data line or a power system wiring via the short-circuited part. At this time, among the respective currents of the output-stage transistors 11 and 12, the current of the output-stage transistor 11 is increased from the reference state, and the current of the output-stage transistor 12 is decreased from the reference state. Accordingly, in the case where the detection circuit 40 is activated, the currents I1 and I2 of the transistors 51 and 52 mirroring the current of the output-stage transistor 11 also increase, and the currents I3 and I4 of the transistors 53 and 54 mirroring the output-stage transistor 12 decrease.

At this time, although the amplitude relationship among the currents I1 to I4 in the reference state is as follows:

$I1<I3, I2>I4$, the relative amplitudes of the currents I1 and I3 are reversed as follows due to the occurrence of the abnormal current:

$I1>I3$, and the difference between the currents I2 and I4 further increases. Accordingly, the output voltages (O1, O2) of the coupling circuit 50 become (H, H), and the determination circuit 60 outputs the determination signal JD indicating that the output current is abnormal.

In FIG. 3, an example in which a current is discharged from the data line of the load 90 to the data line of the adjacent load 99 via the short-circuited part. However, in an example in which a current flows, in a reverse direction, to the data line of the load 90 via the short-circuited part, compared with the case of the reference state, the current of the output-stage transistor 11 decreases, and the current of the output-stage transistor 12 increases. At this time, in the coupling circuit 50, the currents I3 and I4 increase, and the currents I1 and I2 decrease. Therefore, the output voltages (O1, O2) of the coupling circuit 50 become (L, L), and the determination circuit 60 outputs the determination signal JD indicating that the output current is abnormal.

Figure 1:
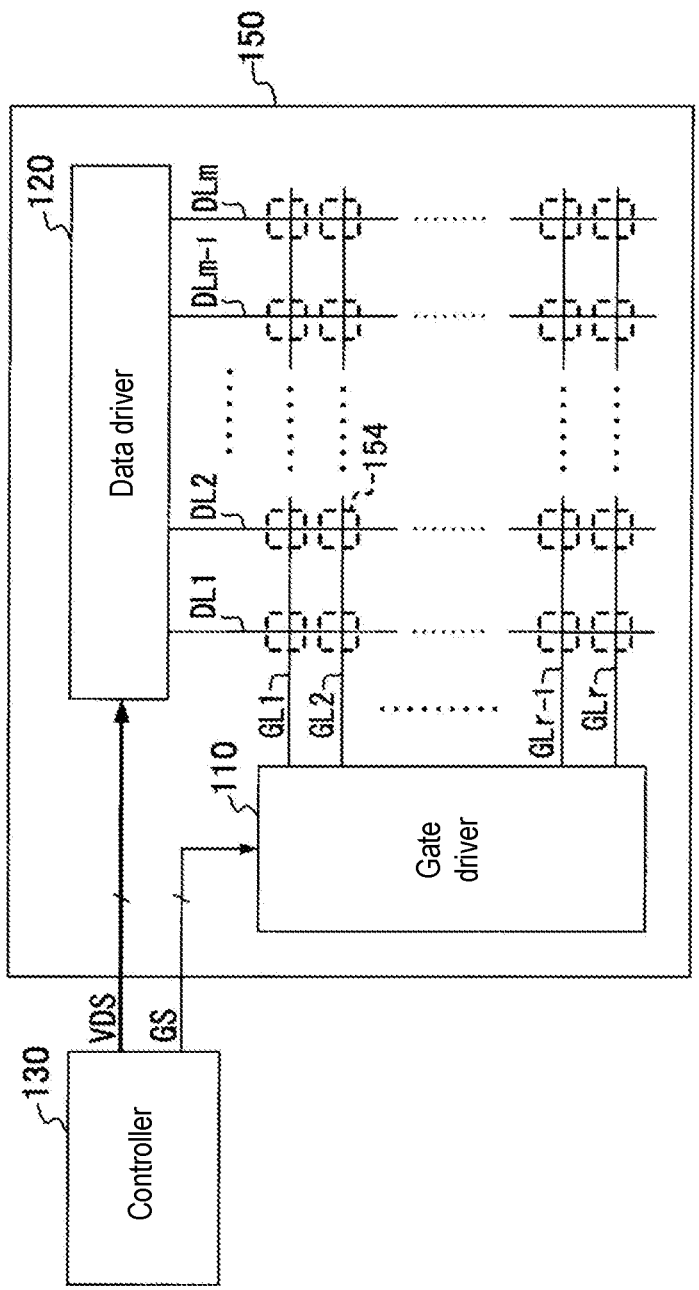
FIG. 1 is a block diagram schematically illustrating a configuration of an active matrix type display apparatus.

It is noted that, differing from the load driving circuit 100 shown in FIG. 1 or 2A that assumes a capacitive load, in the case of a driving circuit in which the output amplifier 10 outputs a constant current to the load 90 at the time of the reference state, such as a power amplifier, the currents of the output-stage transistors 11 and 12 at the time of the reference state are not the same. However, even in such case, the mirror ratio with respect to the currents of the output-stage transistors 11 and 12 are adjusted, and by setting the current output capability of each of the transistors 51 to 54 so that the amplitudes of the currents I1, I2, I3, and I4 at the time of the reference state of the coupling circuit 50 are as follows:

$$I1<I3, I2>I4,$$

it is possible to detect the change (abnormal current) of the output current in the reference state.

In addition, in the load driving circuit 100, by providing the active/inactive switching circuit 20 and activating the detection circuit 40 only during a predetermined detection operation period, the current consumption of the detection circuit 40 can be suppressed to the minimum.

As explicated in the above, the load driving circuit 100 includes the output amplifier 10 and the detection circuit 40, the output amplifier 10 includes the push-pull output-stage formed by the first output-stage transistor 11 and the second output-stage transistor 12 of different conductivity types, and the detection circuit 40 detects an abnormality of the output current output by the output amplifier 10 to the load. The detection circuit 40 includes the coupling circuit 50 and the determination circuit 60 as follows.

That is, the coupling circuit 50 respectively generates the first current and the second current (I1, I2) that are mirror currents with respect to the current flowing in the first output-stage transistor 11, and respectively generates the third current and the fourth current (I3, I4) that are mirror currents with respect to the current flowing in the second output-stage transistor 12. In addition, the coupling circuit 50 couples the first current (I1) and the third current (I3) at the first output node (n7), and outputs the voltage generated at the first output node (n7) as the first voltage (O1). In addition, the coupling circuit 50 couples the second current (I2) and the fourth current (I4) at the second output node (n8), and outputs the voltage generated at the second output node (n8) as the second voltage (O2). It is noted that, in the coupling circuit 50, the first current to the fourth current are respectively generated, so that, at the time of the reference state in which the output current is stable within the predetermined range, the third current (I3) is greater than the first current (I1), and the second current (I2) is greater than the fourth current (I4). The determination circuit 60 detects whether the output current is changed from the reference state that is stable within the predetermined range based on the first voltage and the second voltage (O1, O2), and, in the case of detecting a change, outputs the determination signal JD indicating that the output current is abnormal and, in the case of not detecting a change, outputs the determination signal JD indicating that the output current is normal.

At this time, between the currents flowing in the first output-stage transistor 11 and the second output-stage transistor 12 of the push-pull stage, if one of the currents increases, the other decreases. Accordingly, the voltage (O1) of the coupling point (n7) of the mirror currents (I1 and I3) and the voltage (O2) of the coupling point (n8) of the mirror currents (I2, I4), which serve as the basis for generating the determination signal JD, follow the output current output by the output amplifier 10, and quickly transition to the logic value indicating the determination result (whether the current is abnormal or not).

Moreover, according to the configuration of the coupling circuit 50, the influences of the manufacture variation of the transistors respectively generating the first to fourth currents (I1 to I4) are reduced.

Thus, according to the load driving circuit 100, compared with the case where the current abnormality is determined by using a resistor or a comparator, it is possible to sensitively, accurately, and quickly detect the abnormality of the output current.

Embodiment 2

Figure 4A:
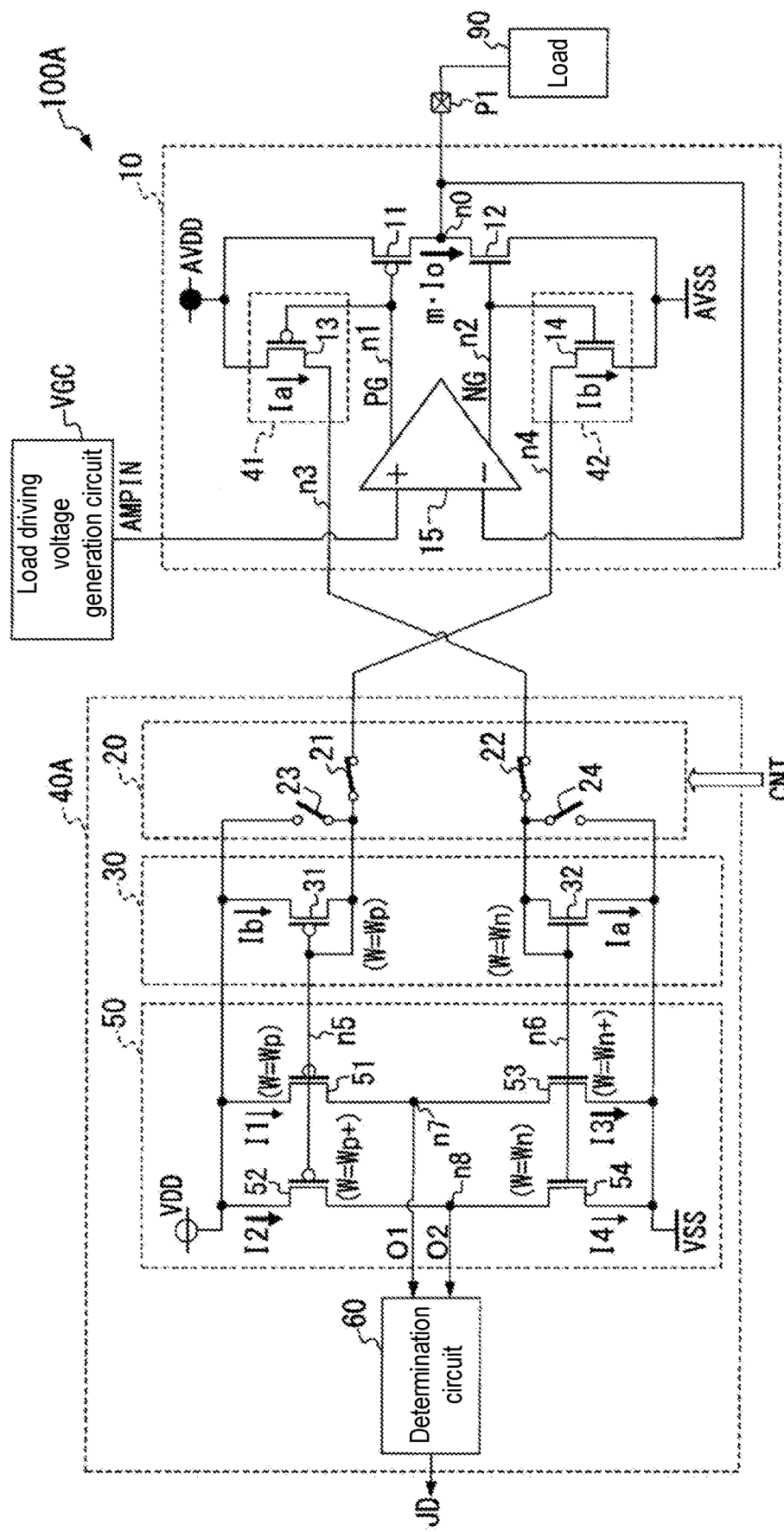
FIG. 4A is a circuit diagram illustrating a configuration of a load driving circuit 100A according to a second embodiment.

FIG. 4A is a circuit diagram illustrating a configuration of a load driving circuit 100A according to a second embodiment of the invention.

The load driving circuit 100A shown in FIG. 4A is formed by a semiconductor IC chip that is a semiconductor device, and includes the load driving voltage generation circuit VGC, the output amplifier 10, and a detection circuit 40A (including mirror current generation parts 41 and 42).

The load driving voltage generation circuit VGC generates a driving voltage AMPIN having a voltage value for driving the load 90, and supplies the driving voltage AMPIN to the output amplifier 10.

The output amplifier 10 and the detection circuit 40A shown in FIG. 4A receive the power potential AVDD for load driving via the AVDD power terminal, and receive the ground potential AVSS for load driving via the AVSS power terminal. In addition, the detection circuit 40A receives the power potential VDD for the logic circuit via the VDD power terminal, and receives the ground potential VSS for the logic circuit via the VSS power terminal. Although the ground potential AVSS for load driving and the ground potential VSS for the logic circuit are generally configured as a common potential, they may also be configured as different power potentials depending on the purpose of application.

The relationship among the magnitudes of the respective power potentials is, for example, as follows:

$$AVSS \leq VSS < VDD \leq AVDD.$$

Although the mirror current generation parts 41 and 42 are shown in a region of a broken line indicating the output amplifier 10 in FIG. 4A, the mirror current generation parts 41 and 42 are components included in the detection circuit 40A.

Like the configuration shown in FIG. 2A, the output amplifier 10 includes the output transistors 11 and 12 as the push-pull output-stage and the differential stage 15 formed by the operational amplifier. Since the operation thereof is the same as that shown in FIG. 2A, the description thereof will be omitted.

The detection circuit 40A is a detection circuit in which the detection circuit 40 shown in FIG. 2A is operable by using the power for the logic circuit, and includes the active/inactive switching circuit 20, a current folding part 30, the mirror current generation parts 41 and 42, the coupling circuit 50, and the determination circuit 60.

In the mirror current generation part 41, the source is applied with the power potential AVDD, and the gate is formed by a Pch transistor 13 connected to the node n1. It is noted that the drain of the transistor 13 is connected to the detection circuit 40A via a node n3.

In the mirror current generation part 42, the source is applied with the ground potential AVSS, and the gate is formed by an Nch transistor 14 connected to the node n2. It is noted that the drain of the transistor 14 is connected to the detection circuit 40A via a node n4.

The circuit configuration of the active/inactive switching circuit 20 shown in FIG. 4A is the same as that shown in FIG. 2A. However, in the configuration shown in FIG. 4A, the switch 21 of the active/inactive switching circuit 20 is connected between the drain (node n4) of the transistor 14 and the common gate (node n5) of the transistors 51 and 52, and the switch 22 is connected between the drain (node n3) of the transistor 13 and the common gate (node n6) of the transistors 53 and 54. The switch 23 is connected between the VDD power terminal and the common gate (node n5) of the transistors 51 and 52, and the switch 24 is connected between the VSS power terminal and the common gate (node n6) of the transistors 53 and 54.

When receiving the control signal CNT with an activating instruction, the active/inactive switching circuit 20 turns on the switches 21 and 22 together, and turns off the switches 23 and 24 together. Accordingly, the drain of the transistor 13 forming the mirror current generation part 41 is connected to the node n6 via the node n3 and the switch 22, and the drain of the transistor 14 forming the mirror current generation part 42 is connected to the node n5 via the node n4 and the switch 21, and the detection circuit 40A becomes enabled.

Meanwhile, in the case of receiving the control signal CNT prompting deactivation, the switches 21 and 22 are turned off together, and the switches 23 and 24 are turned on together. Accordingly, the connection of the drain of each of the transistor 13 forming the mirror current generation part 41 and the transistor 14 forming the mirror current generation part 42 with the coupling circuit 50 is cut off, and the detection circuit 40A becomes disabled.

The current folding part 30 includes a Pch transistor 31 as a first folding transistor and an Nch transistor 32 as a second folding transistor. In the transistor 31, the source is applied with the power potential VDD for the logic circuit, and the gate and the drain are connected to the node n5. In the transistor 32, the source is applied with the ground potential VSS for the logic circuit, and the gate and the drain are connected to the node n6.

Like the coupling circuit 50 shown in FIG. 2A, the coupling circuit 50 includes the Pch transistors 51 and 52, and the Nch transistors 53 and 54. It is noted that, in the coupling circuit shown in FIG. 4A, although the connection of the transistors 51 to 54 is the same as that shown in FIG. 2A, the source of each of the transistors 51 and 52 is applied with the power potential VDD for the logic circuit, and the source of each of the transistors 53 and 54 is applied with the ground potential VSS for the logic circuit.

The determination unit 60 receives the first voltage and the second voltage (O1, O2), and, based on the logic values of the first voltage and the second voltage, detects whether the output current of the output amplifier 10 is changed from the reference state (output stable state). In addition, based on whether there is a detected change, the determination circuit 60 determines whether the output current of the output amplifier 10 is normal or abnormal. In the case where the determination circuit 60 determines that the output current is abnormal, the determination circuit 60 determines in which of the output-stage transistors 11 and 12 the abnormal current flows. The determination circuit 60 outputs a determination signal JD indicating the determination result.

FIG. 4B is a diagram illustrating a determination operation of the determination circuit based on the first voltage O1 and the second voltage O2 in the load driving circuit 100A shown in FIG. 4A.

As shown in FIG. 4B, in the case where binary logic values (L or H) represented by the first voltage O1 and the second voltage O2 are different from each other, the determination circuit 60 outputs the determination signal JD indicating that the output current of the output amplifier 10 is normal.

Meanwhile, in the case where the logic values represented by the voltages O1 and O2 are equal, such as the case where the logic values are both the logic values L, the determination circuit 60 outputs the determination signal JD indicating that there is abnormality in the output current output by the output-stage transistor 11 of the output amplifier 10. Also, in the case where the logic values represented by the voltages O1 and O2 are both H, the determination circuit 60 outputs the determination signal JD indicating that there is abnormality in the output current output by the transistor 12 of the output amplifier 10.

In the following, the operation of the load driving circuit 100A shown in FIGS. 4A and 4B will be further described with details. It is noted that the load 90 and the output amplifier are the same as those shown in FIG. 2A, and the detailed description about the operation thereof will be omitted.

The mirror current generation parts 41 and 42 are provided between the AVDD and AVSS power terminals, like the output-stage transistors 11 and 12. Meanwhile, the main configuration of the detection circuit 40A, except for the mirror current generation parts 41 and 42, can be provided between power terminals different from the output-stage transistors 11 and 12. In FIG. 4A, the current folding part 30, the coupling circuit 50, and the determination circuit 60 are provided between the VDD power terminal receiving the power potential VDD and the VSS power terminal receiving the ground potential VSS.

In the transistor 13 forming the mirror current generation part 41, its own gate, like the gate of the output-stage transistor 11, receives the signal PG output from the differential stage 15, and outputs a mirror current Ia of the source type corresponding to the current output from the output-stage transistor 11 from its own drain to the node n3.

In the transistor 14 forming the mirror current generation part 42, its own gate, like the gate of the output-stage transistor 12, receives the signal NG output from the differential stage and outputs a mirror current Ib of the sink type corresponding to the current flowing in the output-stage transistor 12 from the node n4 to the AVSS power terminal via its own drain.

It is preferable that the mirror ratio of the mirror current pair (Ia, Ib) with respect to the currents of the output-stage transistors 11 and 12 is set to be 1 or less. Accordingly, the current consumption of the detection circuit 40A can be suppressed. Specifically, with respect to the channel widths of the output-stage transistors 11 and 12, the channel widths of the transistors 13 and 14 are set to be small.

Here, in the case where the detection circuit 40A is active, the current Ia of the source type generated by the mirror current generation part 41 is supplied to the drain of the transistor 32 via the node n3 and the switch 22, and is mirrored to the currents I3 and I4 of the transistors 53 and 54 of the coupling circuit 50. In the transistors 32, 53, and 54, the sources and the gates form a current mirror in common connection. That is, the transistor 32 forms a current folding part that folds the current Ia of the source type flowing in the mirror current generation part 41 and mirrors the current Ia to the currents I3 and I4 of the sink type.

The current Ib of the sink type generated by the mirror current generation part 42 flows in the transistor 31 via the node n4 and the switch 21, and is mirrored to the currents I1 and I2 of the transistors 51 and 52 of the coupling circuit 50. In the transistors 31, 51, and 52, the sources and the gates form a current mirror in common connection. That is, the transistor 31 forms a current folding part that folds the current Ib of the sink type flowing in the mirror current generation part 42 and mirrors the current Ib to the currents I1 and I2 of the source type.

The coupling circuit 50, like the transistors 31 and 32 forming the current folding part, is formed by the four transistors 51, 52, 53, and 54 between the VDD power terminal and the VSS power terminal. In the coupling circuit 50 of FIG. 4A, like that of FIG. 2A, the node n7 to which the drains of the transistors 51 and 53 are commonly connected is set as the first output end of the coupling circuit 50, and outputs the voltage O1. In addition, the node n8 to which the drains of the transistors 52 and 54 are commonly connected is set as the second output end of the coupling circuit 50, and outputs the voltage O2.

In addition, regarding the setting of the magnitude of each of the currents I1, I2, I3, and I4 in the reference state in the coupling circuit 50, the size of each of the transistors 51 to 54, for example, is determined so that $$I1 < I3 \text{ and } I2 > I4$$

among the currents I1, I2, I3, and I4. The current output capability of each of the transistors 51 to 54 is set in correspondence with the size of each transistor.

Specifically, the channel widths of the transistors 51 and 54 are respectively set as Wp and Wn, the channel width of the transistor 53 is set as Wn+ greater than Wn, and the channel width of the transistor 52 is set as Wp+ greater than Wp.

That is, except for the power potential VDD and the ground potential VSS that are supplied, the coupling circuit 50 shown in FIG. 4A has the same configuration as the coupling circuit 50 of FIG. 2A. However, differing from the coupling circuit 50 shown in FIG. 2A, the currents I1 and I2 of the source type generated by the coupling circuit 50 of FIG. 4A are generated as the mirror currents with respect to the current of the output-stage transistor 12, and the currents I3 and I4 of the sink type are generated as the mirror currents with respect to the output-stage transistor 11.

In the configuration shown in FIG. 4A, the determination circuit 60 is also provided between the VDD power terminal and the VSS power terminal. The determination circuit 60, like FIG. 2A, receives the two voltages (O1, O2) output from the coupling circuit 50, and, based on the logic values of the voltages (O1, O2), determines whether the output current of the output amplifier 10 is changed from the reference state and outputs the determination signal JD indicating the determination result.

However, compared with the determination circuit 60 of FIG. 2A, the corresponding relationship between the place where an abnormal current occurs (the output-stage transistor 11, 12) and the states of the logic values for determining abnormality (State 2, State 3 of FIG. 4B) is reversed in the determination circuit 60 shown in FIG. 4A.

In this way, in the configuration shown in FIG. 4A, the main configuration part of the detection circuit 40A, except for the mirror current generation parts 41 and 42, can be realized by using a power potential range (VDD to VSS) smaller than the power potential range (AVDD to AVSS) of the detection circuit 40 shown in FIG. 2A. For example, when used in a liquid crystal display apparatus, 18V and 0V are respectively supplied for the power potential AVDD and the ground potential AVSS for load driving, and 1.8V and 0V are supplied for the power potential VDD and the ground potential VSS for the logic circuit. Accordingly, the transistors 31, 32, 51 to 54 and the switches 23, 24 can be realized by using low breakdown voltage elements same as the logic circuit. Therefore, it is possible to reduce the power consumption and the area that is taken up.

Embodiment 3

Figure 5:
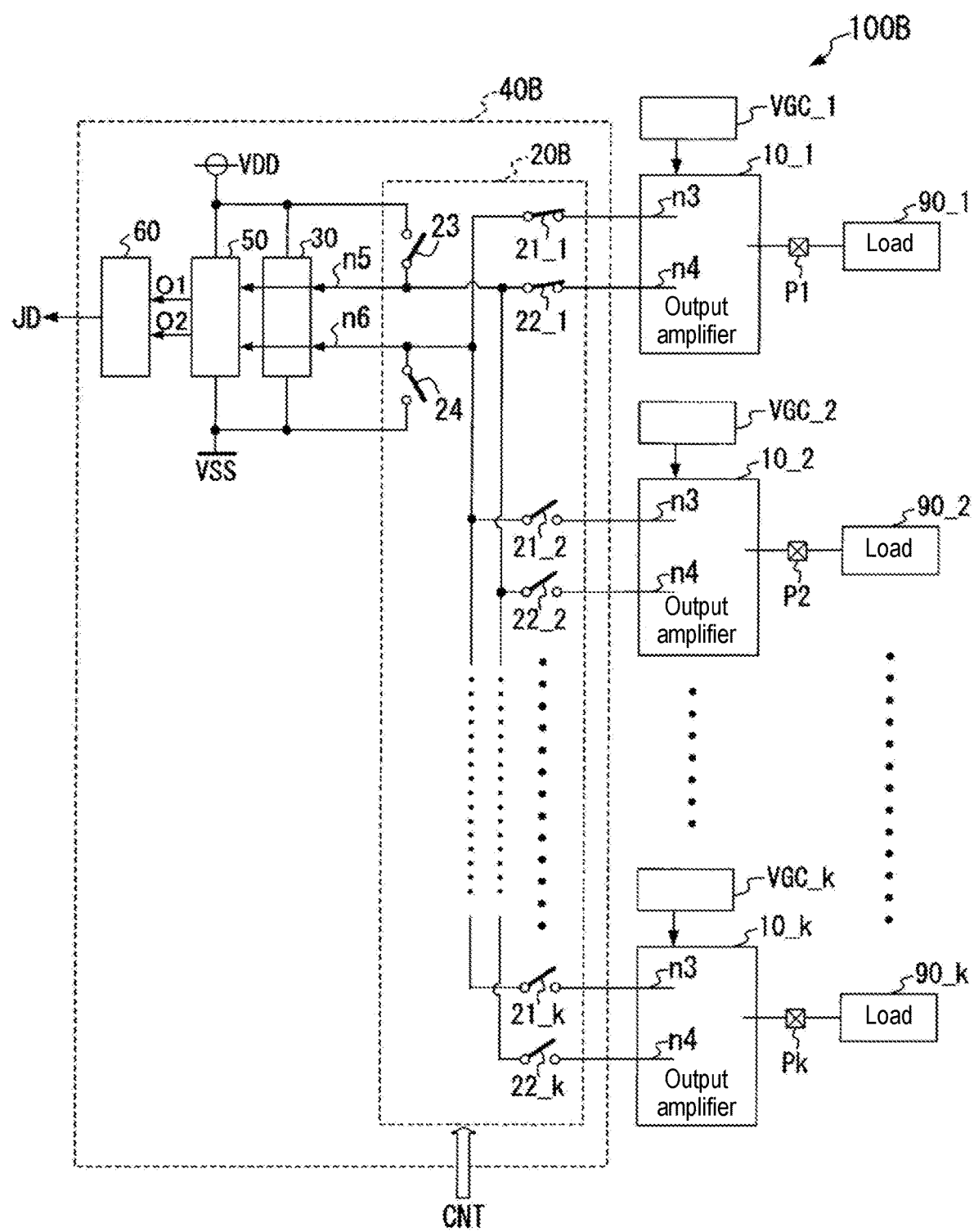
FIG. 5 is a circuit diagram illustrating a configuration of a load driving circuit 100B according to a third embodiment.

FIG. 5 is a block diagram illustrating a configuration of a load driving circuit 100B according to a third embodiment of the invention.

The load driving circuit 100B shown in FIG. 5 is formed by a semiconductor IC chip that is a semiconductor device, and has a configuration including a detection circuit 40B with respect to multiple output amplifiers driving multiple loads (data line loads). Nevertheless, while not shown in FIG. 5, the mirror current generation parts 41 and 42 included in the detection circuit 40B are provided, in the connection configuration shown in FIG. 4A, for each output amplifier.

Specifically, as shown in FIG. 5, the load driving circuit 100B includes output amplifiers 10_1, 10_2, 10_3, ..., 10_k driving multiple loads (data line loads) 90_1, 90_2, 90_3, ... 90_k (k being an integer of 2 or more) via output terminals P1, P2, P3, ..., Pk. It is noted that the configuration of each of the output amplifiers 10_1 to 10_k is the same as the configuration of the output amplifier 10 shown in FIG. 4A.

In addition, in the detection circuit 40B, an active/inactive switching circuit 20B is used in place of the active/inactive switching circuit 20.

The active/inactive switching circuit 20B includes the switches 23 and 24 like the active/inactive switching circuit 20 shown in FIG. 4A. However, in the active/inactive switching circuit 20B, in place of the switches 21 and 22 shown in FIG. 4A, selection switches 21_1 to 21_k and 22_1 to 22_k are used.

In the following, the output amplifier 10_1 shown in FIG. 5, as the representative of the respective output amplifiers 10, and circuits relating to the output amplifier 10_1 are described.

The output amplifier 10_1, like the output amplifier 10 shown in FIG. 4, includes the differential stage 15 and the output-stage transistors 11 and 12.

In addition, the mirror current generation parts 41 and 42 (not shown in FIG. 5) generating the mirror current pairs flowing in the output-stage transistors 11 and 12 and the selection switches 21_1 and 21_2 controlling (selecting) the supply of the mirror current pairs generated by the mirror current generation parts 41 and 42 to the nodes n5 and n6 are connected to the output amplifier 10_1.

In the load driving circuit 100B, the configuration is provided for each output amplifier.

The nodes n5 and n6 are common nodes receiving the mirror current pairs from the mirror current generation parts 41 and 42 connected to each of the output amplifiers 10_1 to k.

Here, when the detection circuit 40B is active, at the time when any set of the selection switches among the selection switches (21_1, 22_1), (21_2, 22_2), ..., (21_k, 22_k) respectively connected to the output amplifiers 10_1, 10_2, ..., 10_k is turned on, whether the output current of the output amplifier 10 corresponding to the selection switches changes can be detected by using the detection circuit 40B.

The sink-type current supplied to the node n5 is converted into the source-type currents I1 and 12 by using the transistors 31, 51, and 52 in the current folding part 30 and the coupling circuit 50 in the detection circuit 40B. Similarly, the current of the source type supplied to the node n6 is converted into the sink-type currents I3 and I4 by using the transistors 32, 53, and 54. The operations and the functions of the coupling circuit 50 and the determination circuit 60 are the same as those in FIGS. 4A and 4B.

Each switch of the active/inactive switching circuit 20B is controlled by the control signal CNT, and the control for activating/deactivating the detection circuit 40B as well as the selection of the output amplifier for detecting whether the output current changes are carried out.

Specifically, when the detection circuit 40B is instructed to be active according to the control signal CNT, the switches 23 and 24 are turned off, and a set of the selection switches among the selection switches (21_1, 22_1), (21_2, 22_2), ..., (21_k, 22_k) are controlled to be turned on. By shifting the timing of turning on each selection switch to carry out the selection, it is possible to detect, in order, the state of the output current of each of the output amplifiers 10_1 to 10_k. When the detection circuit 40B is instructed to be inactive, the switches 23 and 24 are both turned off, and the selection switches (21_1, 22_1), (21_2, 22_2), ..., (21_k, 22_k) are all turned off.

As described above, the load driving circuit 100B shown in FIG. 5 includes the output amplifiers 10_1 to 10_k respectively and individually driving the loads 90_1 to 90_k, and includes the detection circuit 40B of one system with respect to the output amplifiers 10_1 to 10_k.

In the load driving circuit 100B, by using the active/inactive switching circuit 20B, it is possible to selectively detect the change of the output current of each output amplifier with respect to the output amplifiers. At this time, in the load driving circuit 100B, the current abnormality of each of the output amplifiers can be detected by using the detection circuit 40B of one common system. Therefore, the area that is taken up can be reduced.

In addition, the current folding part 30, the coupling circuit 50, the determination circuit 60, and the switches 23 and 24 of the active/inactive switching current 20B of the detection circuit 40B can be formed by using the power potential range (VDD to VSS) of the logic circuit lower than the power potential range (AVDD to AVSS) of each amplifier, so it is possible to further reduce the area that is taken up. Where necessary, a clamping element in serial connection with each selection switch may also be provided between the nodes n3 and n4 of each output amplifier and the nodes n5 and n6 of the detection circuit 40B. The clamping element is provided so that the potentials of the nodes n5 and n6 of the detection circuit 40B, for example, are clamped within the power potential range for the logic circuit. For example, in the case where the clamping element is provided between the nodes n3 and n4 of each output amplifier and each selection switch, each selection switch can also be formed in the power potential range (VDD to VSS) of the logic circuit.

Embodiment 4

Figure 6:
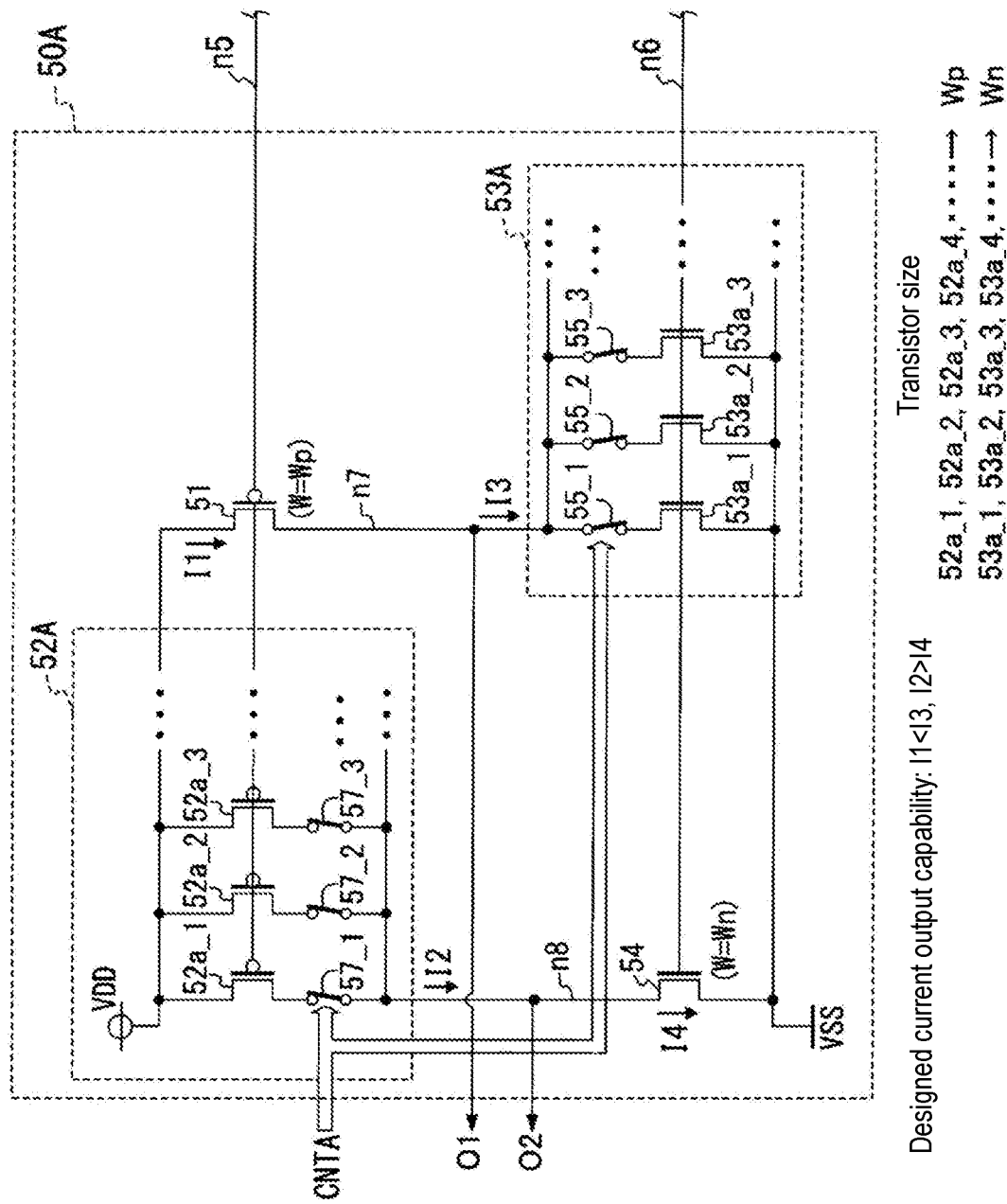
FIG. 6 is a circuit diagram illustrating a configuration of a coupling circuit 50A according to a fourth embodiment.

FIG. 6 is a circuit diagram illustrating a configuration of a coupling circuit 50A, which is another specific example of the coupling circuit 50 shown in FIGS. 2A, 4A, and 5.

In FIG. 6, a voltage for generating the currents I1 and I2 of the source type is supplied to the node n5, and a voltage for generating the currents I3 and I4 of the sink type is supplied to the node n6.

It is noted that, in the coupling circuit 50A, the current output capabilities of the respective transistors are set, so that, in the reference state of the output amplifier, $$I1 < I3 \text{ and } I2 > I4$$

are set for the respective currents I1, I2, I3, and I4.

The coupling circuit 50A includes the Pch transistor 51 outputting the current I1 that is of the source type and in a fixed current amount and the Nch transistor 54 outputting the current I4 that is of the sink type and in a fixed current amount in the reference state, a circuit 52A outputting the current I2 of the source type in the reference state, and a circuit 53A outputting the current I3 of the sink type in the reference state. It is possible for the circuit 52A to adjust the current amount of the current I2 based on a control signal CNTA, and it is possible for the circuit 53A to adjust the current amount of the current I3 based on the control signal CNTA. Accordingly, it is possible for a detection circuit including the coupling circuit 50A to adjust a boundary value, that is, a detection sensitivity, at which the output current of the output amplifier is switched from the reference state (output stable state) to the abnormal state, by using the control signal CNTA.

It is noted that the transistors 51 and 54 shown in FIG. 6 are the same as the transistors 51 and 54 of the coupling circuit 50 shown in FIG. 4A.

In the following, the circuits 52A and 53A are described.

The circuit 52A is in a configuration in which multiple sets of Pch transistors and switches connected in series with each other are provided in parallel between the VDD power terminal receiving the power potential VDD for the logic circuit and the node n8. In multiple Pch transistors 52a_1, 52a_2, ..., arranged in parallel, each source is supplied with the power potential VDD, each gate is commonly connected to the node n5, and mirror currents corresponding to the voltage of the node n5 are respectively generated. Each of switches 57_1, 57_2, ..., arranged in parallel is controlled to be turned on and off based on a current ratio indicated in the control signal CNTA supplied from the outside. At this time, among the switches 57_1, 57_2, ..., a synthesis current of the transistor connected to the switch controlled to be turned on based on the current ratio is set as the current I2. That is, by variably setting the ratio of the Pch transistors 52a_1, 52a_2, ..., controlled to be active or inactive through the ON/OFF control of the switches 57_1, 57_2, ..., the current amount of the current I2 with respect to the current I4 can be optimally adjusted.

The circuit 53A is in a configuration in which multiple sets of Nch transistors and switches connected in series with each other are provided in parallel between the VSS power terminal receiving the ground potential VSS for the logic circuit and the node n7. In multiple Nch transistors 53a_1, 53a_2, ..., arranged in parallel, each source is supplied with the ground potential VSS, each gate is commonly connected to the node n6, and mirror currents corresponding to the voltage of the node n6 are respectively generated. Each of switches 55_1, 55_2, ..., arranged in parallel is controlled to be turned on and off based on a current ratio indicated in the control signal CNTA supplied from the outside. At this time, among the switches 55_1, 55_2, ..., a synthesis current of the transistor connected to the switch controlled to be turned on based on the current ratio is set as the current I3. That is, by variably setting the ratio of the Nch transistors 53a_1, 53a_2, . . . , controlled to be active or inactive through the ON/OFF control of the switches 55_1, 55_2, . . . , the current amount of the current I3 with respect to the current I1 can be optimally adjusted.

In the following, a specific example of setting the current output capability in each transistor shown in FIG. 6 is described.

For example, the current output capability of a Pch transistor which has the channel width Wp and in which the gate is connected to the node n5, and the current output capability of an Nch transistor which has the channel width Wn and in which the gate is connected to the node n6 are equal.

The channel width of the Pch transistor 51 generating the current I1 of the source type of the coupling circuit 50A is set as Wp, and the channel width of the Nch transistor 54 generating the current I4 of the sink type is set as Wn.

The circuit 52A generating the current I2 of the source type is controlled by the control signal CNTA, so that a synthesis current equivalent to three Pch transistors of the channel width Wp is generated.

The circuit 53A generating the current I3 of the sink type is controlled by the control signal CNTA, so that a synthesis current equivalent to three Nch transistors of the channel width Wn is generated.

Accordingly, the ratio among the current amounts of the respective currents I1, I2, I3, and I4 in the reference state can be set as follows:

$$I1:I3=1:3;$$

$$I2:I4=3:1.$$

Here, in the case where the difference between the ratio of the current amount of the current I3 with respect to the current I1 and the ratio of the current amount of the current I2 with respect to the current I4 is set to be large, the boundary value for switching the output current of the output amplifier 10 to the abnormal state is increased. In addition, in the case where the difference between the ratios of the current amounts is set to be small, the boundary value for switching the output current of the output amplifier 10 to the abnormal state is decreased. By adjusting the ratio of the current amount, it is possible to optimally adjust the detection sensitivity.

Figure 7:
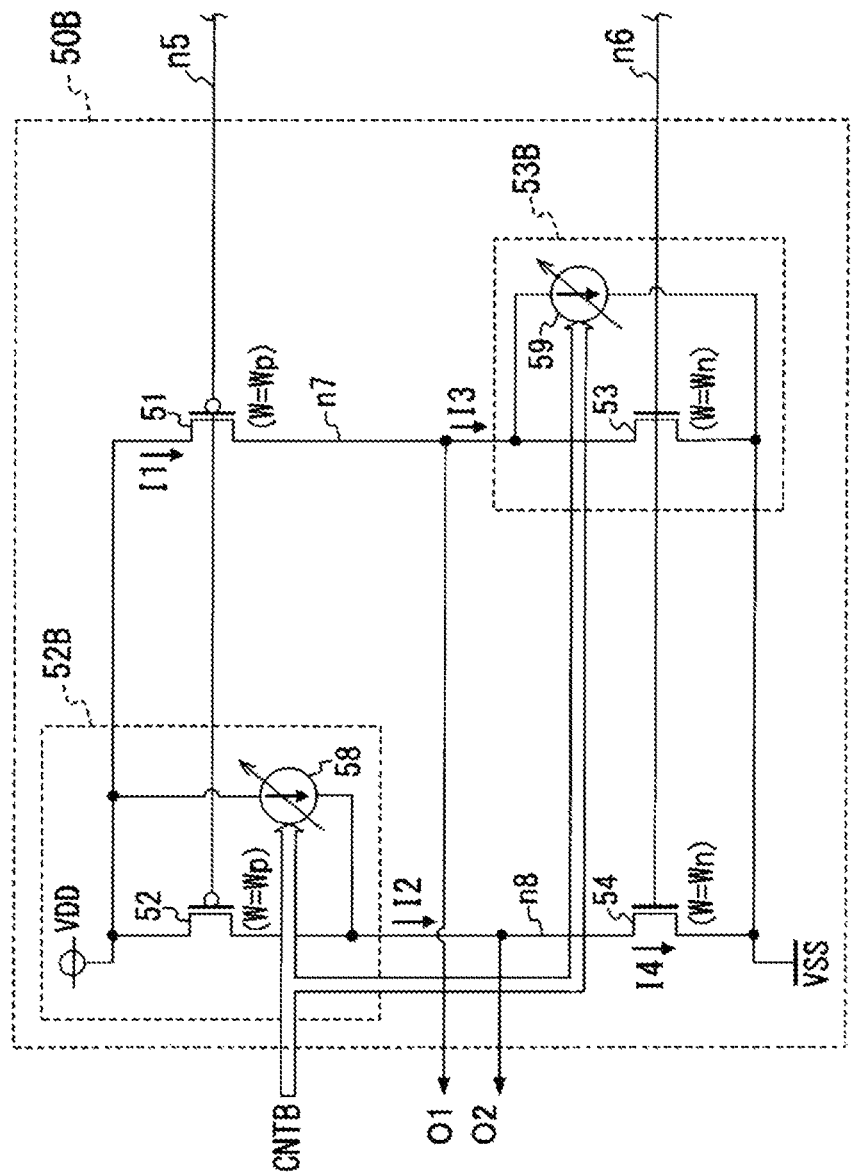
FIG. 7 is a circuit diagram illustrating a configuration of a coupling circuit 50B as a modified example of the coupling circuit 50A.

FIG. 7 is a circuit diagram illustrating a configuration of a coupling circuit 50B as a modified example of the coupling circuit 50A shown in FIG. 6.

In the coupling circuit 50B, like the configuration shown in FIG. 6, the voltage for generating the currents I1 and I2 of the source type is supplied to the node n5, and the voltage for generating the currents I3 and I4 of the sink type is supplied to the node n6.

In addition, in the coupling circuit 50B, the current output capabilities of the respective transistors are set, so that, in the reference state of the output amplifier, $$I1<I3 \text{ and } I2>I4$$

are set for the respective currents I1, I2, I3, and I4.

The coupling circuit 50B includes the Pch transistor 51 in which the current I1 of the source type is set to a fixed value in the reference state, the Nch transistor 54 in which the current I4 of the sink type is set to a fixed value in the reference state, and circuits 52B and 53B capable of individually making variable adjustment to the current amounts of the current I2 of the source type and the current I3 of the sink type, respectively, in the reference state.

It is noted that the transistors 51 and 54 shown in FIG. 6 are the same as the transistors 51 and 54 of the coupling circuit 50 shown in FIG. 4A.

Here, the configurations of the circuits 52B and 53B are described in the following.

The circuit 52B has a configuration in which the Pch transistor 52 and a variable current source 58 are provided in parallel between the VDD power terminal receiving the power potential VDD for the logic circuit and the node n8.

In the transistor 52, the source is supplied with the power potential VDD, the gate is connected to the node n5, and a mirror current corresponding to the voltage of the node n5 is generated.

In the variable current source 58, a current amount is controlled based on a current ratio indicated in a control signal CNTB supplied from the outside, and a current having the current amount flows between the VDD power terminal and the node n8. Accordingly, a synthesis current of the transistor 52 and the variable current source 58 is set as the current amount of the current I2. That is, through the current control of the variable current source 58, the difference between the current amount of the current I4 and the current amount of the current I2 can be set optimally.

The circuit 53B has a configuration in which the Nch transistor 53 and a variable current source 59 are provided in parallel between the VSS power terminal receiving the ground potential VSS for the logic circuit and the node n7.

In the transistor 53, the source is supplied with the ground potential VSS, the gate is connected to the node n6, and a mirror current corresponding to the voltage of the node n6 is generated.

In the variable current source 59, a current amount is controlled based on a current ratio indicated in the control signal CNT, and a current having the current amount flows between a node n7 and the VSS power terminal. Accordingly, a synthesis current of the transistor 53 and the variable current source 59 is set as the current amount of the current I3. That is, through the current control of the variable current source 59, the difference between the current amount of the current I1 and the current amount of the current I3 can be set optimally.

In the following, a specific example of setting the current output capability in the configuration shown in FIG. 7 is described.

For example, the current output capability of a Pch transistor which has the channel width Wp and in which the gate is connected to the node n5, and the current output capability of an Nch transistor which has the channel width Wn and in which the gate is connected to the node n6 are equal. The channel width of the transistor 51 generating the current I1 of the source type of the coupling circuit 50B is set as Wp, and the channel width of the transistor 54 generating the current I4 of the sink type is set as Wn. In the circuit 52B generating the current I2 of the source type, the channel width of the transistor 52 is set as Wp. In the circuit 53B generating the current I3 of the sink type, the channel width of the transistor is set as Wn.

Accordingly, the difference between the current amounts of the currents I1 and I3 in the reference state is determined by the current amount of the variable current source 59, and the difference between the current amounts of the currents I2 and I4 is determined by the current amount of the variable current source 58. In FIG. 7 as well, by adjusting the ratio of the current amount of the current I3 with respect to the current I1 and the ratio of the current amount of the current I2 with respect to the current I4, it is possible to optimally adjust the detection sensitivity, like FIG. 6.

It is noted that, in each coupling circuit of FIGS. 6 and 7, it is preferable that the difference between the current amounts of the currents I1 and I3 in the reference state and the difference between the current amounts of the currents I2 and I4 in the reference state are set so that slight changes due to the manufacture variation of each transistor, the ambient temperature within a predetermined range, etc., fall within the range of the reference state.

In addition, in each coupling circuit in FIGS. 6 and 7, although the transistors 51 and 54 respectively generating the currents I1 and I4 are described as individual transistors for the ease of description, the transistors may also be configured by multiple transistors as long as the ratio among the current amounts of the currents I1, I2, I3, and I4 in the reference state can be set appropriately. In addition, the sizes of the respective transistors are not limited to those shown in FIGS. 6 and 7.

Embodiment 5

In the following, a specific example for the case in which the load driving circuit 100B shown in FIG. 5 is applied to the display apparatus is described.

Figure 8:
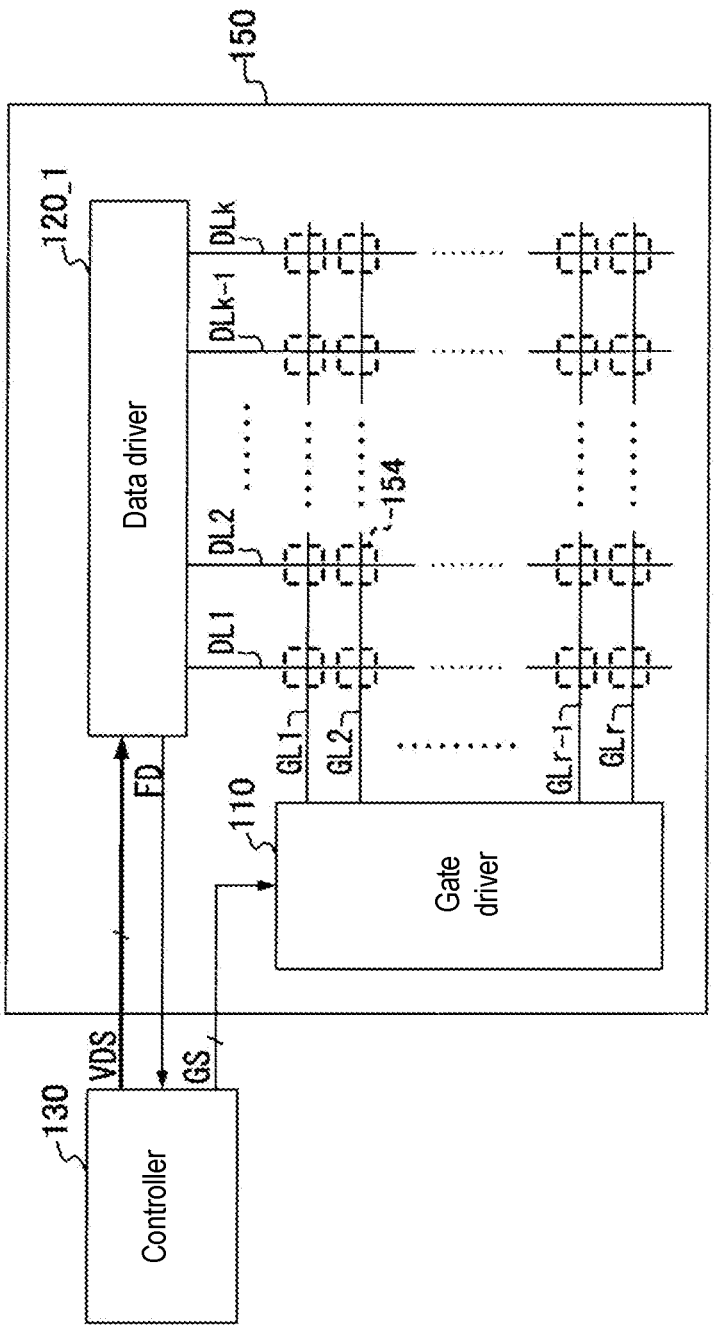
FIG. 8 is a block diagram illustrating a configuration of a display apparatus provided with a data driver 120_1 including the load driving circuit 100B.

FIG. 8 is a block diagram illustrating a configuration of a display apparatus provided with a data driver 120_1 including the load driving circuit 100B.

The display apparatus shown in FIG. 8 includes the display panel 150 and the controller 130. The display panel 150 includes the gate lines GL1 to GLr (r being an integer of 2 or more) arranged in the horizontal direction on an insulating substrate, data lines DL1 to DLk (k being an integer of 2 or more) arranged in the vertical direction, and the pixel parts 154 arranged in a matrix at the intersection parts between the respective gate lines and data lines. On the display panel 150, the gate driver 110 driving each gate line and the data driver 120_1 driving each data line are provided, and the controller 130 adjusts the output timings of the gate driver 110 and the data driver 120_1.

The gate driver 110 is supplied with a signal group GS form the controller 130, and outputs a scan signal supplied to each gate line based on the signal group GS.

The data driver 120_1 is supplied with the video data signal VDS including CLK, and various control signals and video data signals, etc., from the controller 130, and, based on the video data signal VDS, outputs gradation signals supplied to the data lines DL1 to DLk.

It is noted that the data driver 120_1 is usually formed by using a silicon LSI, and is implemented to an end part of the display panel 150 by using chip-on-glass (COG) or chip-on-film (COF). In the case where the data driver 120_1 is formed by multiple individual ICs, the video data signal VDS including various control signals relating to data lines and each responsible for driving is supplied to each data driver IC from the controller 130. In the case where the data driver 120_1 is a single IC or formed by a limited number of ICs, the controller 130 may be built in the data driver 120_1. In such case, the signal group supplied from the outside to the controller 130 is directly supplied to the data driver 120_1.

Figure 9:
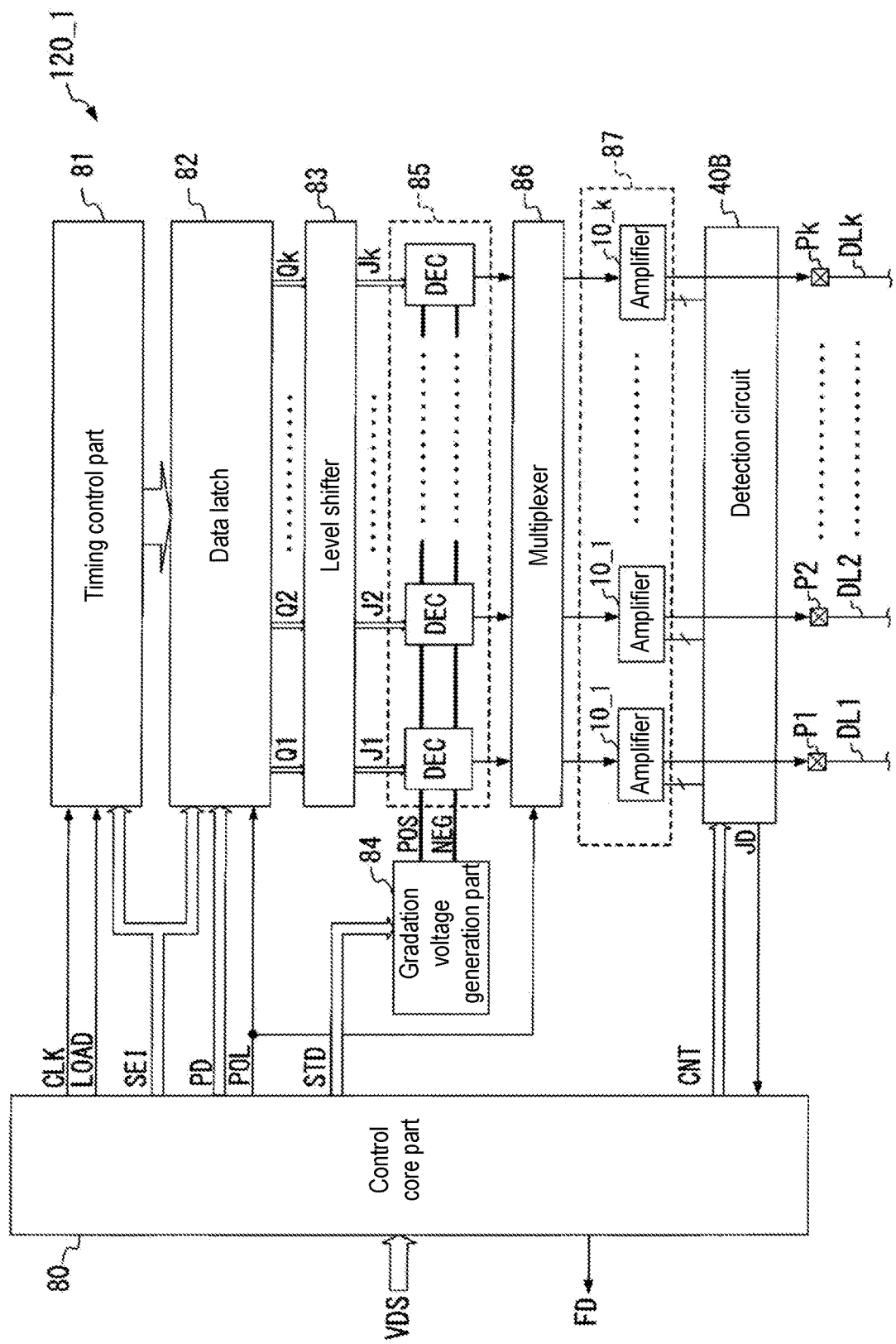
FIG. 9 is a block diagram illustrating a configuration of the data driver 120_1.

FIG. 9 is a block diagram illustrating an example of the internal configuration of the data driver 120_1.

As shown in FIG. 9, the data driver 120_1 includes a control core part 80, a timing control part 81, a data latch 82, a level shifter 83, a gradation voltage generation part 84, a decoder 85, a multiplexer 86, an output amplification part 87, and the detection circuit 40B. In addition, the data driver 120_1 receives the power potential for the logic circuit and the power potential for driving the data line (load) from the outside. The power potential for the logic circuit is supplied to the control core part 80, the timing control part 81, the data latch 82, and the detection circuit 40B, and the power potential for load driving is supplied to the level shifter 83, the gradation voltage generation part 84, the decoder 85, the multiplexer 86, and the output amplification part 87.

The control core part 80 receives the video data signal VDS in serial arrangement supplied from the outside. The video data signal VDS is a signal including a clock CLK or various signal groups as well as setting information and is a serialized signal. The control core part 80 applies a serial/parallel conversion process on the video data signal VDS, and extracts a series of video data PD, the clock CLK, the various signal groups (a horizontal synchronization signal, a vertical synchronization signal, and various control signals), and the setting information from the video data signal VDS.

The control core part 80 generates a reference timing signal LOAD and a polarity reversing signal POL based on the horizontal synchronization signal and the vertical synchronization signal. The control core part 80 supplies the clock CLK, the reference timing signal LOAD, and setting information SEI to the timing control part 81. In addition, the control core part 80 supplies the series of the video data PD, the setting information SEI, and the polarity reversing signal POL to the data latch 82. In addition, the control core part 80 supplies gamma setting information STD to the gradation voltage generation part 84, supplies the polarity reversing signal POL to the multiplexer 86, and supplies the control signal CNT to the detection circuit 40B. In addition, the control signal CNT may also include the control signal CNTA or CNTB corresponding to the coupling circuit of FIG. 6 or 7.

Based on the reference timing signal LOAD, the clock CLK, and the setting information SEI, the timing control part 81 generates a latch output timing signal group controlling the timing of the gradation signal output from each of the output terminals P1 to Pk of the data driver 120_1 and supplies the latch output timing signal group to the data latch 82.

For each output respectively corresponding to k pixels per horizontal scan line, the data latch 82 imports k video data PD from the series of video data PD in accordance with the latch output timing group, and supplies, as video data Q1 to Qk, the k video data PD to the level shifter 83.

The level shifter 83 includes k level shifting circuits individually performing level shifting on the amplitudes of the respective signal levels of the video data Q1 to Qk. The level shifting circuits generate digital video data J1 to Jk with respect to the video data Q1 to Qk. In the digital data J1 to Jk, respective signal level amplitudes are level-shifted to a high amplitude that is greater.

The gradation voltage generation part 84, based on the gamma setting information STD and for the respective primary colors (red, green, blue) of pixels, generates multiple positive polarity gradation voltage groups POS and negative polarity gradation voltage groups NEG having voltage values in accordance with the gamma conversion characteristics corresponding to the primary colors.

The decoder part 85 includes k decoders individually converting the respective digital video data J1 to Jk into analog voltage values. These k decoders use the positive polarity gradation voltage groups POS or the negative polarity gradation voltage groups NEG, convert the respective digital video data J1 to Jk into positive or negative polarity analog gradation voltages corresponding to the luminance represented by a video data piece, and supply the k analog gradation signals that are obtained to the multiplexer 86.

The multiplexer 86 supplies, to the output amplification part 87, k analog gradation signals in which the arrangement in the series of k analog gradation signals, such as the exchange of the even-numbered ones and odd-numbered ones, is changed based on the polarity reversing signal POL.

As shown in FIG. 5, the output amplification part 87 includes the output amplifiers 10_1 to 10_k each having the circuit configuration (including 41 and 42) shown in FIG. 4A. The output amplifiers 10_1 to 10_k respectively output k gradation signals in which the k analog gradation signals supplied from the multiplexer 86 are individually amplified to the data lines DL1 to DLk via the output terminals P1 to Pk.

As shown in FIG. 5, the detection circuit 40B includes the active/inactive switching circuit 20B as well as the current folding part 30 and the coupling circuit 50 for one system and with the internal configurations shown in FIG. 4.

The mirror current generation parts 41 and 42 mirroring the currents of the output-stage transistors 11 and 12 are connected to the respective output amplifiers 10_1 to 10_k, the mirror current pair selected, by the active/inactive switching circuit 20B, from the mirror current pairs generated by the respective mirror current generation parts is transmitted to the coupling circuit 50 of the detection circuit 40B, and whether the output current changes with respect to the reference state of the output amplifier is detected to determine whether the current is normal or abnormal.

The active/inactive control with respect to the detection circuit 40B and the selection control of the active/inactive switching circuit 20B is controlled through the control signal CNT from the control core part 80. In addition, the determination signal JD of the detection circuit is supplied to the control core part 80. It is noted that, at the time when the output current of the output amplifier is determined as abnormal by the detection circuit 40B, in the case of transmitting an abnormality detection notification to the user or stopping the display apparatus, for example, it may also be that the control core part 80 outputs a signal FB indicating such fact to an external controller based on the determination signal JD.

It is noted that, if the above configuration is applied to the data driver of an organic EL display apparatus, the polarity reversing signal POL and the multiplexer 86 shown in FIG. 9 are omitted.

Figure 10:
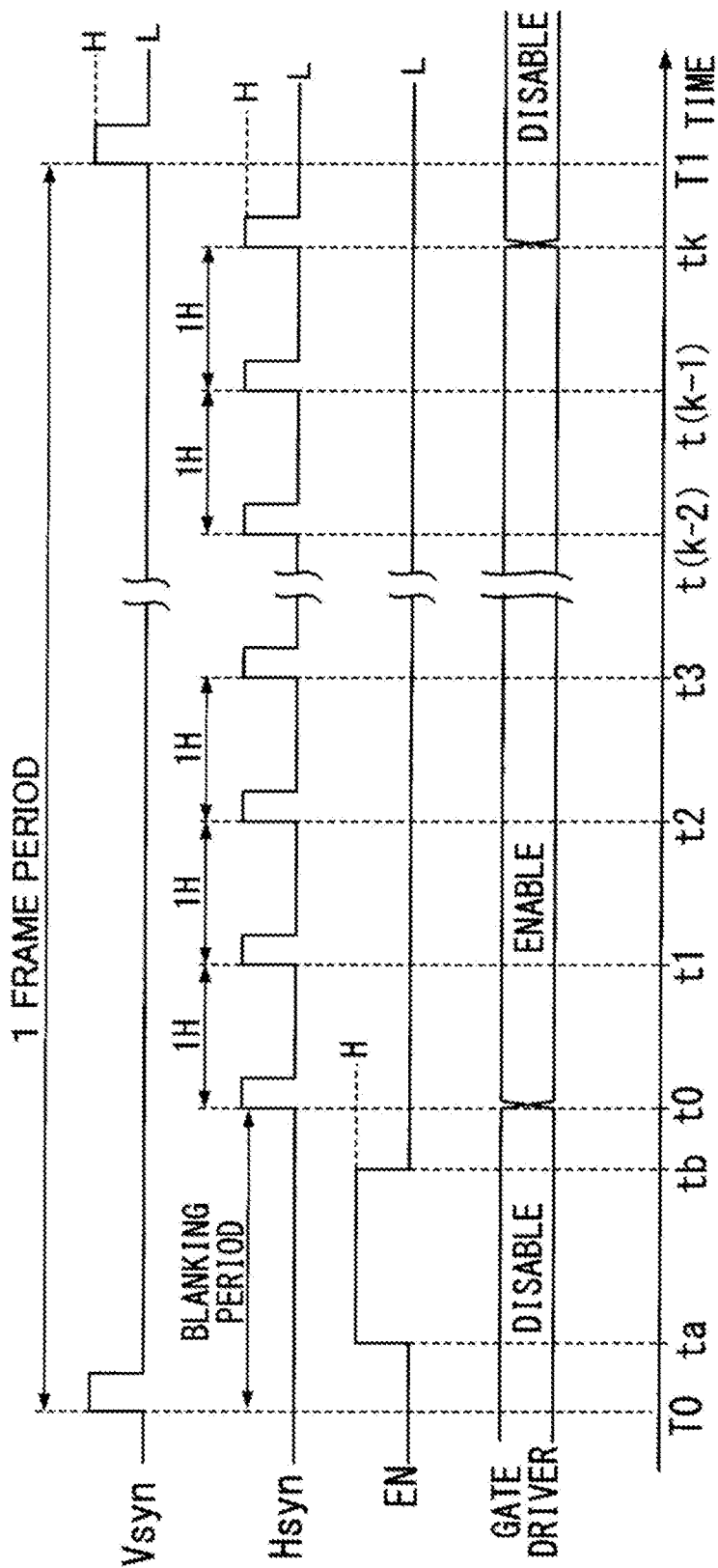
FIG. 10 is a timing chart illustrating an example of the timing for performing abnormal current detection of a data line in the data driver 120_1.

FIG. 10 is a timing chart illustrating an example of the timing for performing abnormal current detection of a data line in the data driver 120_1.

In FIG. 10, the timing of one frame period from T0 to T1 corresponding to the re-writing period of one frame is shown. The one-frame period is defined by the vertical synchronization signal (Vsyn). In a period from T0 to t0 immediately after the one-frame period starts, there is a blanking period reflecting various setting signals. In a video data active period from t0 to tk after the blanking period, the analog gradation signals corresponding to the video data are output to data lines in one horizontal period (1H). In addition, according to the scan signal output from the gate driver 110, in the video data active period from t0 to tk, gate lines are selected in order in association with the timing (Hsyn) of one horizontal period, and the gate lines are set in a non-selected state in periods other than the data active period.

The detection circuit 40B mounted in the data driver 120_1 shown in FIG. 8 is activated and performs a detection operation in an abnormality detection period from ta to tb during the blanking period from T0 to t0, for example. In the abnormality detection period from ta to tb, control may also be exerted so that the output amplifier connected to the data line of the detection target is selected in order by the active/inactive switching circuit 20B. Alternatively, it may also be that the output amplifiers selected in the abnormality detection period in one frame period are set as a limited number of output amplifiers, and for each frame period, different output amplifiers are selected in order, and whether there is an abnormal current is detected for all the data lines in multiple frame periods.

According to the data driver 120_1 shown in FIG. 8, it is possible to provide the data driver with a function of detecting malfunctioning of a display panel by detecting an abnormal current to the data line.

What is claimed is:

1. A load driving circuit, comprising:
   an output amplifier, having a push-pull output-stage formed by a first output-stage transistor and a second output-stage transistor having different conductivity types, and outputting an output current output from the push-pull output-stage to a load; and
   a detection circuit, detecting a change of the output current,
   wherein the detection circuit comprises:
   a coupling circuit, respectively generating a first current and a second current that are mirror currents with respect to a current flowing in one of the first output-stage transistor and the second output-stage transistor, respectively generating a third current and a fourth current that are mirror currents with respect to a current flowing in an other of the first output-stage transistor and the second output-stage transistor, coupling the first current and the third current at a first output node to output a voltage generated at the first output node as a first voltage, and coupling the second current and the fourth current at a second output node to output a voltage generated at the second output node as a second voltage;
   wherein the coupling circuit respectively generates the first to fourth currents, so that, in a reference state in which the output current is stable within a predetermined range, the third current is greater than the first current and the second current is greater than the fourth current, and
   wherein the detection circuit detects, based on the first voltage and the second voltage output from the coupling circuit, whether the output current is changed from the reference state or not.

2. The load driving circuit as claimed in claim 1, wherein:
   the coupling circuit couples the first current and the third current by transmitting the first current to the first output node and extracting the third current from the first output node, and couples the second current and the fourth current by transmitting the second current to the second output node and extracting the fourth current from the second output node.

3. The load driving circuit as claimed in claim 1, wherein the detection circuit further comprises a determination circuit, outputting, based on the first voltage and the second voltage, a determination signal indicating that the output current is abnormal when the output current is changed from the reference state and a determination signal indicating that the output current is normal when the output current is not changed.

4. The load driving circuit as claimed in claim 3, wherein the determination circuit determines that the output current is normal in a case where a logic value based on the first voltage and a logic value based on the second voltage are different from each other, and determines that the output current is abnormal in a case where the logic value based on the first voltage and the logic value based on the second voltage are consistent.

5. The load driving circuit as claimed in claim 1, wherein the detection circuit comprises an active/inactive switching circuit that receives a control signal indicating active or inactive, and, in a case where the control signal indicates active, performs its own detection operation, and, in a case where the control signal indicates inactive, stops the detection operation.

6. The load driving circuit as claimed in claim 1, wherein the coupling circuit comprises:
a first transistor circuit pair, respectively generating the first current and the third current and having conductivity types different from each other; and
a second transistor circuit pair, respectively generating the second current and the fourth current and having conductivity types different from each other,
wherein a transistor circuit generating the first current in the first transistor circuit pair is formed by at least one transistor, and an other transistor circuit generating the third current in the first transistor circuit pair is formed by a plurality of transistors connected in parallel,
a transistor circuit generating the fourth current in the second transistor circuit pair is formed by at least one transistor, and an other transistor circuit generating the second current in the second transistor circuit pair is formed by a plurality of transistors connected in parallel, and
in the transistors, a ratio of a number of transistors controlled to be active or inactive is set to be variable according to the control signal.

7. The load driving circuit as claimed in claim 1, wherein the coupling circuit comprises:
a first transistor circuit pair, respectively generating the first current and the third current and having conductivity types different from each other; and
a second transistor circuit pair, respectively generating the second current and the fourth current and having conductivity types different from each other,
wherein a transistor circuit generating the first current in the first transistor circuit pair is formed by at least one transistor, and an other transistor circuit generating the third current in the first transistor circuit pair is formed by at least one transistor and a first current source connected in parallel,
a transistor circuit generating the fourth current in the second transistor circuit pair is formed by at least one transistor, and an other transistor circuit generating the second current in the second transistor circuit pair is formed by at least one transistor and a second current source connected in parallel, and
in the first current source and the second current source, current values are set to be variable by the control signal.

8. The load driving circuit as claimed in claim 1, wherein the load driving circuit has a first reference potential and a first power potential forming a first power potential range and a second reference potential and a second power potential forming a second power potential range smaller than the first power potential range and provided within the first power potential range,
the first output-stage transistor and the second output-stage transistor generate currents that are output respectively based on the first power potential and the first reference potential,
the detection circuit comprises a current folding part which generates, based on the second reference potential and the second power potential, a mirror current pair with respect to the currents output from the first output-stage transistor and the second output-stage transistor, and the coupling circuit, based on the second reference potential and the second power potential, generates the first to fourth currents from the mirror current pair generated by the current folding part.

9. The load driving circuit as claimed in claim 1, wherein the load driving circuit comprises k output amplifiers, k being an integer of 2 or more,
wherein the detection circuit:
comprises a selection switch selecting, in order, each of k mirror current pairs respectively generated by the k output amplifiers and respectively formed by a first mirror current with respect to the current flowing in the one of the first output-stage transistor and the second output-stage transistor and a second mirror current with respect to the current flowing in the other of the first output-stage transistor and the second output-stage transistor, and
respectively generates the first current and the second current as mirror currents with respect to the first mirror current in the mirror current pair selected by the selection switch, and respectively generates the third current and the fourth current as mirror currents with respect to the second mirror current in the mirror current pair selected by the selection switch.

10. The load driving circuit as claimed in claim 1, wherein the output amplifier has an output end to which the load is connected,
in the first output-stage transistor of the output amplifier, a source receives a first power potential, and a drain is connected to the output end, and in the second output-stage transistor, a source receives a first reference potential, and a drain is connected to the output end,
the coupling circuit comprises:
a first transistor, generating the first current;
a second transistor, generating the second current;
a third transistor, generating the third current; and
a fourth transistor, generating the fourth current,
wherein in the first transistor, a source receives the first power potential, a gate is connected to the gate of the first output-stage transistor, and a drain is connected to the first output node,
in the second transistor, a source receives the first power potential, a gate is connected to the gate of the first output-stage transistor, and a drain is connected to the second output node,
in the third transistor, a source receives the first reference potential, a gate is connected to the gate of the second output-stage transistor, and a drain is connected to the first output node, and
in the fourth transistor, a source receives the first reference potential, a gate is connected to the gate of the second output-stage transistor, and a drain is connected to the second output node.

11. The load driving circuit as claimed in claim 8, wherein the output amplifier has an output end to which the load is connected,
in the first output-stage transistor of the output amplifier, a source receives the first power potential, a drain is connected to the output end, and in the second output-stage transistor, a source receives the first reference potential, and a drain is connected to the output end, wherein the detection circuit comprises:

a first mirror current generation transistor, wherein a source receives the first power potential, a gate is connected to a gate of the first output-stage transistor, and a drain is connected to a third node;

a second mirror current generation transistor, wherein a source receives the first reference potential, a gate is connected to a gate of the second output-stage transistor, and a drain is connected to a fourth node;

a first folding transistor, wherein a source receives the second power potential, and a gate and a drain are connected to the fourth node; and a second folding transistor, wherein a source receives the second reference potential, and a gate and a drain are connected to the third node, the coupling circuit comprises:

a first transistor, generating the first current;

a second transistor, generating the second current;

a third transistor, generating the third current; and a fourth transistor, generating the fourth current, wherein in the first transistor, a source receives the second power potential, a gate is connected to the fourth node, and a drain is connected to the first output node, in the second transistor, a source receives the second power potential, a gate is connected to the fourth node, and a drain is connected to the second output node, in the third transistor, a source receives the second reference potential, a gate is connected to the third node, and a drain is connected to the first output node, and in the fourth transistor, a source receives the second reference potential, a gate is connected to the third node, and a drain is connected to the second output node.

12. A display driver, comprising k load driving circuits as claimed in claim 1, k being an integer of 2 or more, wherein the display driver outputs a determination signal, which indicates whether the output current is changed from the reference state or not, to outside while respectively outputting k output currents output from the k load driving circuits to k data lines of a display panel.

13. The display driver as claimed in claim 12, wherein the display driver receives a video signal indicating an image displayed on the display panel, and the detection circuit is activated and performs a detection operation of detecting the abnormality of the output current in a blanking period of each frame in the video signal.

14. A display apparatus, comprising the display driver as claimed in claim 12.

15. The load driving circuit as claimed in claim 2, wherein the detection circuit further comprises a determination circuit, outputting, based on the first voltage and the second voltage, a determination signal indicating that the output current is abnormal when the output current is changed from the reference state and a determination signal indicating that the output current is normal when the output current is not changed.

16. The load driving circuit as claimed in claim 2, wherein the detection circuit comprises an active/inactive switching circuit that receives a control signal indicating active or inactive, and, in a case where the control signal indicates active, performs its own detection operation, and, in a case where the control signal indicates inactive, stops the detection operation.

17. The load driving circuit as claimed in claim 2, wherein the coupling circuit comprises:

a first transistor circuit pair, respectively generating the first current and the third current and having conductivity types different from each other; and a second transistor circuit pair, respectively generating the second current and the fourth current and having conductivity types different from each other, wherein a transistor circuit generating the first current in the first transistor circuit pair is formed by at least one transistor, and an other transistor circuit generating the third current in the first transistor circuit pair is formed by a plurality of transistors connected in parallel, a transistor circuit generating the fourth current in the second transistor circuit pair is formed by at least one transistor, and an other transistor circuit generating the second current in the second transistor circuit pair is formed by a plurality of transistors connected in parallel, and in the transistors, a ratio of a number of transistors controlled to be active or inactive is set to be variable according to the control signal.

18. The load driving circuit as claimed in claim 2, wherein the coupling circuit comprises:

a first transistor circuit pair, respectively generating the first current and the third current and having conductivity types different from each other; and a second transistor circuit pair, respectively generating the second current and the fourth current and having conductivity types different from each other, wherein a transistor circuit generating the first current in the first transistor circuit pair is formed by at least one transistor, and an other transistor circuit generating the third current in the first transistor circuit pair is formed by at least one transistor and a first current source connected in parallel, a transistor circuit generating the fourth current in the second transistor circuit pair is formed by at least one transistor, and an other transistor circuit generating the second current in the second transistor circuit pair is formed by at least one transistor and a second current source connected in parallel, and in the first current source and the second current source, current values are set to be variable by the control signal.

* * * * *